(12) United States Patent
Matsubara et al.

(10) Patent No.: US 7,057,937 B1
(45) Date of Patent: Jun. 6, 2006

(54) DATA PROCESSING APPARATUS HAVING A FLASH MEMORY BUILT-IN WHICH IS REWRITABLE BY USE OF EXTERNAL DEVICE

(75) Inventors: Kiyoshi Matsubara, Higashimurayama (JP); Masanao Sato, Tokyo (JP); Hirofumi Mukai, Musashino (JP); Eiichi Ishikawa, Kodaira (JP)

(73) Assignees: Renesas Technology Corp., Tokyo (JP); Hitachi ULSI Systems Co., Ltd., Kodaira (JP)

( * ) Notice: Subject to any disclaimer, the term of this patent is extended or adjusted under 35 U.S.C. 154(b) by 0 days.

(21) Appl. No.: 09/132,085

(22) Filed: Aug. 10, 1998

Related U.S. Application Data

(63) Continuation of application No. 08/941,254, filed on Sep. 30, 1997, now Pat. No. 5,844,843, which is a continuation of application No. 08/524,107, filed on Aug. 21, 1995, now Pat. No. 5,687,345, which is a continuation of application No. 08/103,800, filed on Aug. 10, 1993, now abandoned, which is a continuation-in-part of application No. 08/031,877, filed on Mar. 16, 1993, now abandoned.

(30) Foreign Application Priority Data

| Mar. 17, 1992 | (JP) | ................................... 4-091919 |
| Mar. 19, 1992 | (JP) | ................................... 4-093908 |
| Aug. 10, 1992 | (JP) | ................................... 4-234310 |

(51) Int. Cl.
*G11C 7/00* (2006.01)

(52) U.S. Cl. .................... 365/185.24; 365/185.01; 365/185.33

(58) Field of Classification Search .......... 365/185.24, 365/185.01, 185.33, 230.03, 218
See application file for complete search history.

(56) References Cited

U.S. PATENT DOCUMENTS

| 4,402,065 A | 8/1983 | Taylor ........................ 365/189 |
| 4,698,750 A | 10/1987 | Wilkie et al. ............... 365/218 |
| 4,701,886 A | 10/1987 | Sakakibara ................ 371/21.1 |
| 4,783,764 A | 11/1988 | Tsuchiya et al. ............ 365/174 |
| 4,785,425 A | 11/1988 | Lavelle ........................ 365/52 |

(Continued)

FOREIGN PATENT DOCUMENTS

EP  0 183 232 A2  6/1986

(Continued)

OTHER PUBLICATIONS

EDN Electrical Design News, vol. 28, No. 21, Oct. 13, 1983, pp. 177-188.

(Continued)

*Primary Examiner*—Vu A. Le
(74) *Attorney, Agent, or Firm*—Antonelli, Terry, Stout & Kraus, LLP

(57) ABSTRACT

A data processing apparatus having a built-in flash memory and being capable of rewriting the built-in flash memory by use of versatilely used PROM writer has a CPU, an electrically rewritable nonvolatile flash memory both formed in a single semiconductor substrate, and is operable in a mode in which the built-in flash memory is rewritable in accordance with commands supplied from a PROM writer. The data processing apparatus has a command latch made externally writable when the above-mentioned operation mode is established, a command analyzer and a sequence controller for controlling a sequence of rewriting the flash memory in accordance with the analysis result. The command analyzer and sequence controller may be realized by the CPU.

41 Claims, 25 Drawing Sheets

U.S. PATENT DOCUMENTS

| | | | |
|---|---|---|---|
| 4,794,558 A | 12/1988 | Thompson | 364/900 |
| 4,796,235 A | 1/1989 | Sparks et al. | 365/328 |
| 4,807,114 A | 2/1989 | Itoh | 364/200 |
| 4,887,234 A | 12/1989 | Iijima | 364/900 |
| 4,953,129 A | 8/1990 | Kobayashi et al. | 365/203 |
| 4,974,208 A | 11/1990 | Nakamura et al. | 365/189.01 |
| 4,975,878 A * | 12/1990 | Boddu et al. | 365/195 |
| 5,065,364 A | 11/1991 | Atwood et al. | 365/218 |
| 5,070,473 A | 12/1991 | Takano et al. | 395/725 |
| 5,088,023 A | 2/1992 | Nakamura et al. | 395/430 |
| 5,097,445 A | 3/1992 | Yamauchi | 365/195 |
| 5,109,359 A | 4/1992 | Sakakibara et al. | 365/189.07 |
| 5,175,840 A | 12/1992 | Sawase et al. | 395/425 |
| 5,185,718 A | 2/1993 | Rinerson et al. | 365/185 |
| 5,199,001 A | 3/1993 | Tzeng | 365/218 |
| 5,200,600 A | 4/1993 | Shinagawa | 235/492 |
| 5,222,046 A | 6/1993 | Kreifels et al. | 365/185 |
| 5,255,237 A | 10/1993 | Kodama | 365/218 |
| 5,255,244 A | 10/1993 | Dey | 365/233 |
| 5,283,758 A | 2/1994 | Nakayama et al. | 365/185 |
| 5,297,096 A | 3/1994 | Terada et al. | 365/218 |
| 5,305,276 A | 4/1994 | Uenoyama | 365/230.01 |
| 5,305,284 A | 4/1994 | Iwase | 365/238.5 |
| 5,321,845 A | 6/1994 | Sawase et al. | 395/800 |
| 5,329,492 A | 7/1994 | Mochizuki | 365/230.03 |
| 5,369,647 A | 11/1994 | Kreifels et al. | 371/25.1 |
| 5,377,145 A | 12/1994 | Kynett et al. | 365/189.05 |
| 5,390,146 A | 2/1995 | Atwood et al. | |
| 5,402,383 A | 3/1995 | Akaogi | 365/218 |
| 5,418,742 A | 5/1995 | Asano et al. | 365/218 |
| 5,418,752 A | 5/1995 | Harari et al. | |
| 5,444,664 A | 8/1995 | Kuroda et al. | 365/226 |
| 5,566,125 A | 10/1996 | Fazio et al. | 365/45 |
| 5,581,503 A | 12/1996 | Matsubara et al. | 365/185.33 |
| 5,602,738 A | 2/1997 | Sasaki | |
| 5,615,159 A | 3/1997 | Roohparvar | 365/201 |

FOREIGN PATENT DOCUMENTS

| | | |
|---|---|---|
| EP | 0373672 | 6/1990 |
| EP | 0 447 856 A1 | 9/1990 |
| EP | 0392895 | 10/1990 |
| EP | 0 489 204 A1 | 6/1992 |
| JP | 59-29448 | 2/1984 |
| JP | 59-071179 | 4/1984 |
| JP | 60-254344 | 12/1985 |
| JP | A-60-256868 | 12/1985 |
| JP | 62-117633 | 6/1987 |
| JP | 63-206852 | 8/1988 |
| JP | 1-161469 | 6/1989 |
| JP | 1-273296 | 11/1989 |
| JP | 1-298600 | 12/1989 |
| JP | 2-89555 | 7/1990 |
| JP | 2-241060 | 9/1990 |
| JP | 2-289997 | 11/1990 |
| JP | 2-310786 | 12/1990 |
| JP | 3-014272 | 1/1991 |
| JP | 3-078195 | 4/1991 |
| JP | 3-187263 | 8/1991 |
| JP | 3-229955 | 10/1991 |
| JP | 3-250495 | 11/1991 |

OTHER PUBLICATIONS

Patent Abstracts of Japan, vol. 14, No. 542 (p-1137), Sep. 4, 1990.

Electronic Engineering, vol. 63, No. 775, Jul. 1991, p. 49.

IBM Technical Disclosure Bulletin, vol. 32, No. 10B, pp. 141-142, Mar. 1990, "Method of Reducing DRAM Power Dissipation with Segmented Bitlines".

Hitachi IC Memory Data Book 1, p. 872, Sep. 1981.

*Block Structure in Flash Memory*, Electronic Engineering 63 Jul., 1991, No. 775, Woolwich, London, GB.

Ko-Min Chang, "A Modular Flash EEPROM Technology For 0.8 μm High Speed Logic Circuits", IEEE 1991 Custom Integrated Circuits Conference, pp. 18.7.1-18.7.4.

* cited by examiner

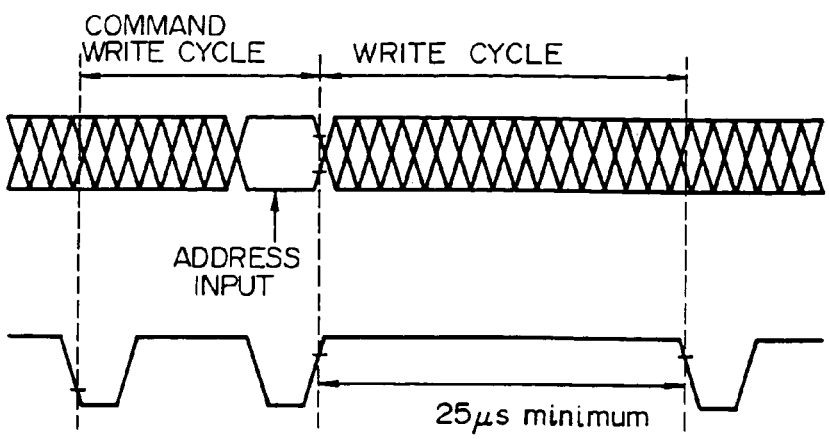
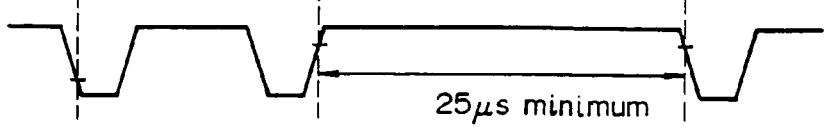
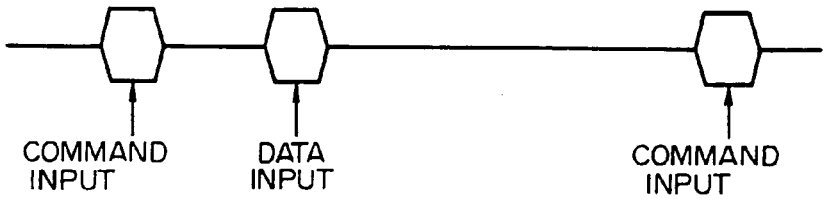
FIG. 6A ADDRESS
FIG. 6B WRITE SIGNAL
FIG. 6C DATA
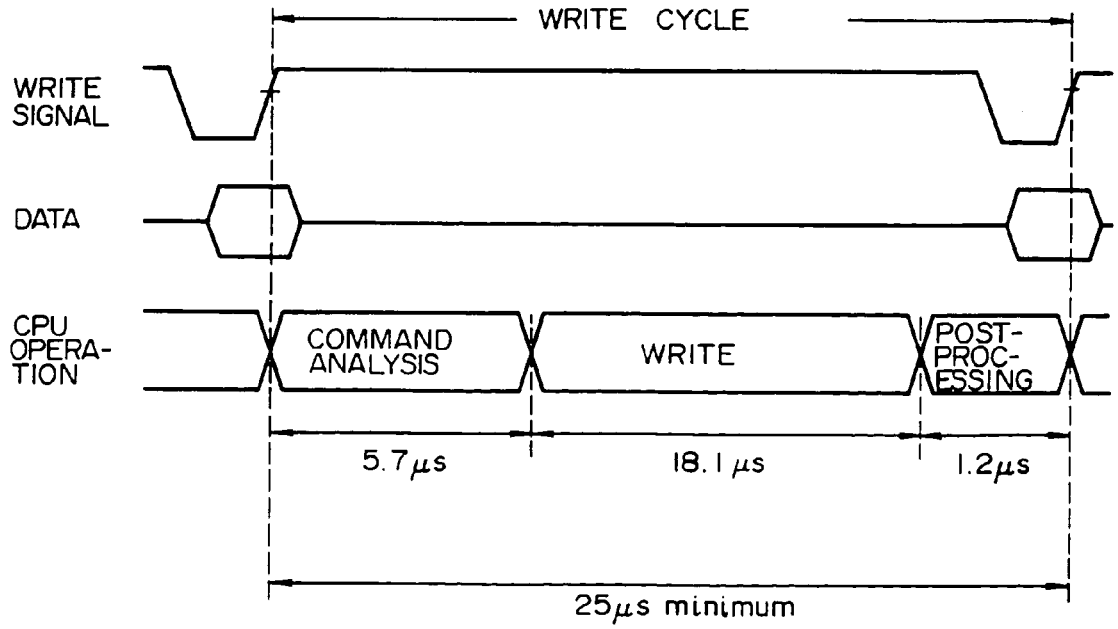
FIG. 7

F I G. 10
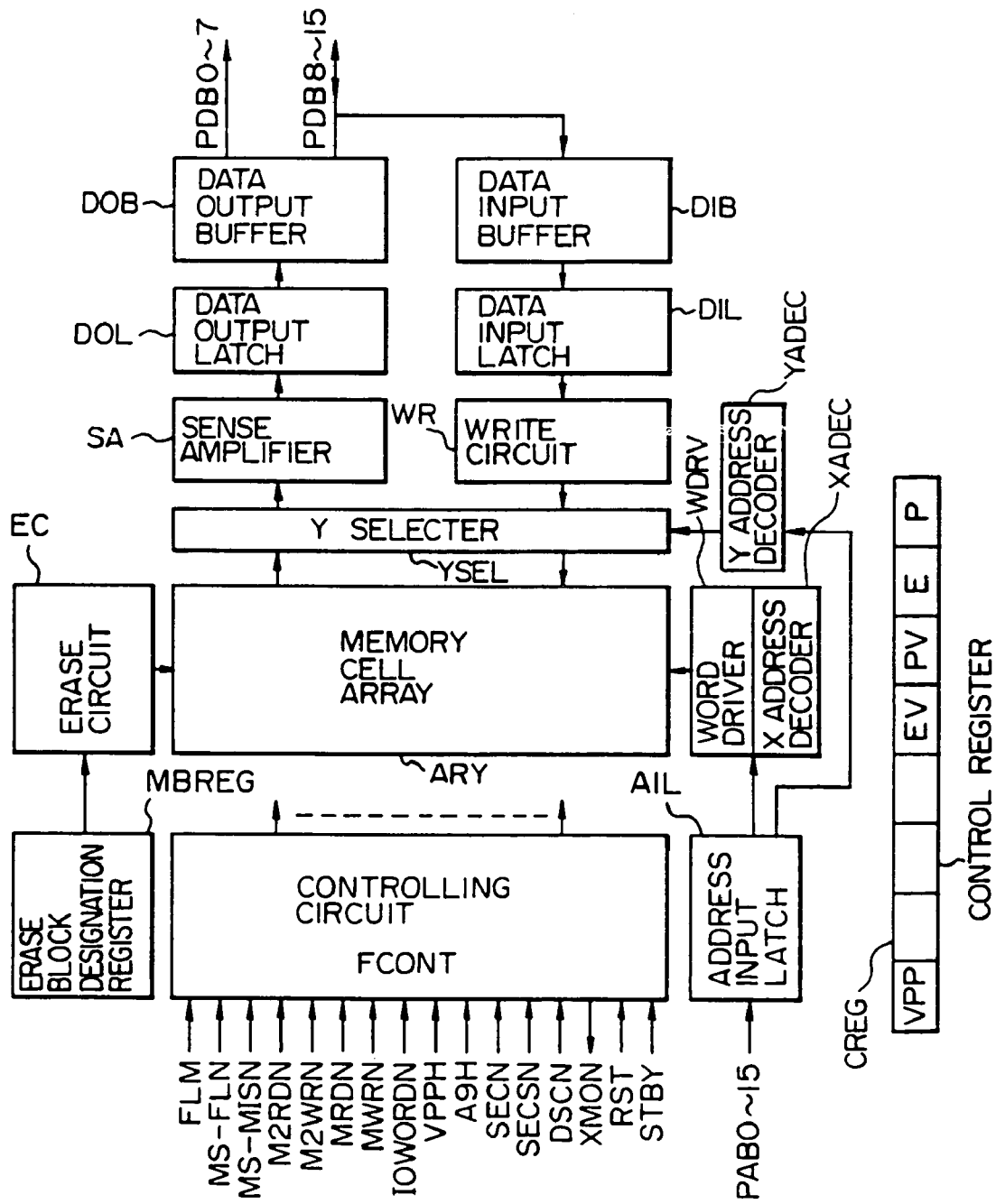

FIG. 11
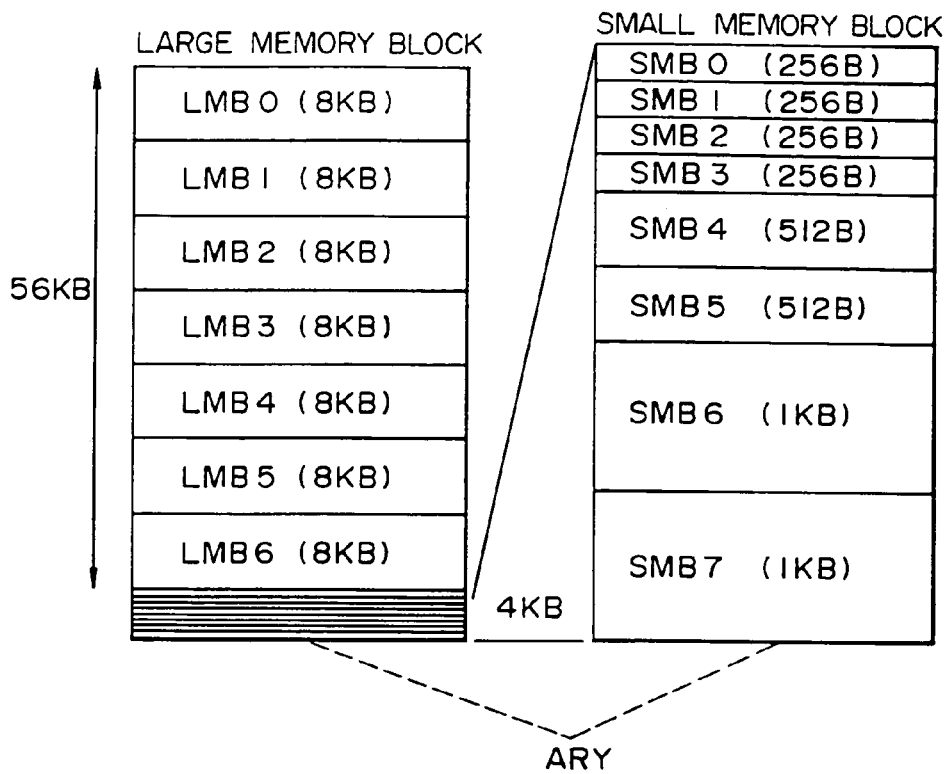
FIG. 12A
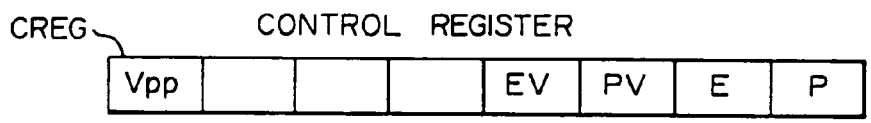
Vpp    Vpp APPLICATION FLAG
EV     ERASE VERIFY FLAG
PV     PROGRAM VERIFY FLAG
E      ERASE FLAG
P      PROGRAM FLAG
FIG. 12B  ERASE BLOCK DESIGNATION REGISTER FOR LARGE MEMORY BLOCKS
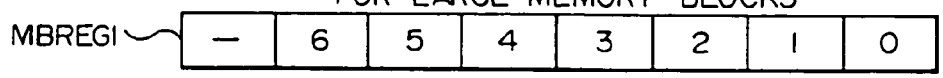
FIG. 12C  ERASE BLOCK DESIGNATION REGISTER FOR SMALL MEMORY BLOCKS

FIG. 19B

RESET ("RESET")

(2) WHEN RESET COMMAND IS INPUTTED TO INTERRUPT ANOTHER COMMAND

| FLAG STATE | | WE* | |
|---|---|---|---|
| C F | D F | | |
| 1 | 0 | ‾\_ | ADDRESS IS LATCHED (DON'T CARE) |
| 1 | 0 | _/‾ | COMMAND IS LATCHED IN CL |

* C F : "1" → "0"
              * D F : "0" → "1"

(UNDER CPU OPERATION)

* D F : "1" → "0"

| 0 | 1 | | |
|---|---|---|---|
| 0 | 0 | ‾\_ | ADDRESS IS LATCHED<br>COMMAND IS LATCHED IN CL |
| 0 | 0 | _/‾ | COMMAND IS DECODED BY DECODER |

* BUSES : DISCONNECTED
              * C F : "0" (UNCHANGED)

OPERATION OF CPU

IF RESET COMMAND IS INPUTTED DURING WRITE MODE, "FFH" WILL BE WRITTEN AS DATA. HOWEVER, SINCE "FFH" REPRESENTS NO DATA TO BE WRITTEN, NO DATA WILL BE ACTUALLY WRITTEN.

IF RESET COMMAND IS INPUTTED DURING ERASE MODE, ERASE OPERATION WILL BE ENDED AFTER RECOGNITION OF THE 2ND COMMAND AS NOT BEING ERASE COMMAND.

FOR OPERATION AFTER 2ND COMMAND INPUT, ABOVE OPERATION IS FOLLOWED.

DATA PROCESSING APPARATUS HAVING A FLASH MEMORY BUILT-IN WHICH IS REWRITABLE BY USE OF EXTERNAL DEVICE

CROSS-REFERENCE TO RELATED APPLICATIONS

This application is a continuation of application Ser. No. 08/941,254, filed Sep. 30, 1997, now U.S. Pat. No. 5,844,843 which was a continuation of application Ser. No. 08/524,107, filed Aug. 21, 1995, now U.S. Pat. No. 5,687,345, which was a continuation of application Ser. No. 08/103,800, filed Aug. 10, 1993, now abandoned, and which, in turn, was a continuation-in-part (CIP) of application Ser. No. 08/031,877, filed Mar. 16, 1993, now abandoned, the entire disclosures of which are incorporated herein by reference.

BACKGROUND OF THE INVENTION

The present invention relates to a data processing apparatus having a built-in electrically rewritable nonvolatile flash memory. Further, the present invention relates to a technology which makes the built-in flash memory rewritable by use of an external device such as a PROM writer in the same way as a discrete flash memory, and to a technology which is useful when applied to a microcomputer, for example.

JP-A-161469 (laid-open on Jun. 26, 1989 and corresponding to U.S. Application No. 116,607 filed on Nov. 3, 1987) describes a microcomputer having an EPROM (Erasable and Programmable Read-Only Memories) or an EEPROM (Electrically Erasable and Programmable Read-Only Memories) as a programmable nonvolatile memory formed in a single semiconductor chip. Programs and data are held in such a nonvolatile memory disposed in the on-chip arrangement in the microcomputer. Since the EPROM needs ultraviolet rays to erase the stored data, rewrite cannot be effected unless the chip is removed from the applied system. Meanwhile, since the EEPROM can be electrically erased and written, the stored data can be rewritten with the EEPROM mounted onto the system. However, since memory cells constituting the EEPROM need select transistors besides the memory elements, such as MNOSs (Metal Nitride Oxide Semiconductors), the size of the memory cell becomes about 2.5 to 5 times as large as that of the memory cell of the EPROM. Therefore, a relatively large area of the chip is necessary for the nonvolatile flash memory portion.

JP-A-2-289997 (laid-open on Nov. 29, 1990) describes a simultaneous erase type EEPROM. This simultaneous erase type EEPROM is synonymous to the flash memory disclosed in this specification. Data of the flash memory can be rewritten by implementing a sequence of electrical erase and write operations, and the memory cell of this flash memory can be constituted by one transistor in the same way as the EPROM. Further, the flash memory has the function of simultaneously, electrically erasing all the memory cells as a bulk or, alternatively, one or more blocks of memory cells. Therefore, the stored data of the flash memory can be rewritten with the flash memory kept mounted on the system (in the on-board state). This simultaneous erase function can shorten the rewrite time, and also contributes to the reduction of the chip occupying area.

U.S. Pat. No. 4,701,886 issued on Oct. 20, 1987 to Y. Sakakibara et al discloses a one-chip microcomputer having an EPROM. Data stored in that EPROM can be changed by externally supplying new data thereto from an EPROM writer.

U.S. Pat. No. 4,807,114 issued on Feb. 21, 1989 to S. Itoh discloses a microcomputer which is programmable either externally or by its internal control function.

SUMMARY OF THE INVENTION

The present inventors have made investigations of a microcomputer having a flash memory mounted thereon. Though the microcomputer having a built-in flash memory can perform on-board rewrite (namely, rewrite in a state in which the memory is mounted on a board), for an initial writing, write efficiency may be, in some cases, higher with a write device such as a PROM writer before the memory is mounted on a board, that is, before the memory is mounted onto a system (e.g., an automobile engine control system, a camera, a VTR, etc.) than with the on-board write technique, depending on a mode of use by a user. Thus, the present inventors have first found out the necessity for supporting the write function by a writer which is versatilely utilized for write operations of both EPROMs and EEPROMs, such as a PROM writer, by connecting the writer through a socket adapter, to such a microcomputer with the built-in flash memory, too. Rewrite, namely, erase and write of the flash memory in this case requires more complicated control in comparison with the EPROMs and EEPROMs. To avoid over-erase (a phenomenon in which a threshold voltage of a memory cell transistor becomes so small and further becomes negative that normal readout is no longer possible) which is the problem inherent in the flash memory, particularly in the case of an erase operation, an erase technique which effects a pre-write operation for making the write level uniform before commencing with the erase operation or technique which gradually carries out an erase operation while effecting a verify function, becomes necessary. A control procedure for such a processing cannot be assigned to a versatile PROM writer as such, because a problem occurs in the processing, and it is not practical, either, to cope with this problem with a writer for exclusive use for the microcomputer having the built-in flash memory, such as the PROM writer.

It is an object of the present invention to provide a data processing apparatus having a built-in flash memory which is user-friendly in writing data therein by use of an external device such as a PROM writer, before the apparatus is mounted on a circuit board.

It is another object of the present invention to provide a data processing apparatus having a function of rewriting a built-in flash memory by use of an external device versatilely utilized such as a PROM writer.

Further, it is another object of the present invention to provide a data processing apparatus, which minimizes the increase of a circuit scale to be additionally incorporated at this time for the purpose of data write by the external device.

The above and other objects and novel features of the present invention will become more apparent from the following description of the specification and the drawings.

Main aspects of the present invention will be explained briefly as follows.

(a) According to one aspect of the present invention, a data processing apparatus includes a central processing unit and an electrically rewritable nonvolatile flash memory both formed in a single semiconductor substrate, and is operable in an operation mode in which the built-in flash memory is rewritable in accordance with commands from an external device, and comprises command latch means which is writable from outside in the above-mentioned operation mode, command analysis (e.g., decoding) means for analyzing (e.g., decoding) predetermined commands latched in the command latch means, and control means for executing sequence control for a rewriting of the flash memory in accordance with a result of the analysis.

(b) During the rewrite operation of the flash memory by the external device, the built-in central processing unit (the central processing unit constituting the data processing apparatus) need not execute separate processing, and may be substantially at halt. In this instance, if the built-in central processing unit is used for executing the processings of the command analysis means and the control means described above, an exclusive circuit for rewriting such as the command analysis means and the control means can be reduced.

The external device versatilely utilized, such as an EPROM writer, has a function of applying a high voltage for rewrite to a nonvolatile memory device and a function of supplying an address for rewrite and data to a semiconductor device (LSI) coupled thereto and including the flash memory in accordance with a write signal and others. Such an external device supplies commands, data and addresses asynchronously with respect to the central processing unit built-in in the data processing apparatus. Thus, the data processing apparatus may further include, in the structure described in (a) above, flag means for indicating that a command is written in the command latch means, data latch means which is writable from outside when the flag means indicates a command latch state, and address latch means in which address data is writable from outside so as to prevent collision between a command and a data, that are written from the external device in mutually different cycles, on the latch means. Thereby, the central processing unit reads the command in the command latch means on the basis of the command latch state of the flag means.

(c) If the control for the flag means is also assigned to the central processing unit, the central processing unit must always monitor the content of the command latch means using a bus cycle, which will be a wasteful operation. Accordingly, the data processing apparatus may further include, in the structure described in (b) above, a command decoder for decoding the latch content of the command latch means and setting the flag means for the command latch state when decoding a predetermined command. Thereby, speed-up of control of the flag means will be possible.

(d) If the central processing unit analyzes all the latched commands, the operation designated by some of the commands may be too late in timing. An example is a read command for reading out data from the flash memory. To cope with this problem, the data processing apparatus may further include, in the structure described in (c) above, gate means which is provided in an internal bus and is capable of selecting the operation state where the command latch means, the data latch means and the address latch means are connected to the flash memory and to the central processing unit and another operation state where the command latch menas, the data latch means and the address latch means are connected to the flash memory but are not connected to the central processing unit, and this gate means being controlled by a signal generated by the command decoder when it decodes a command other than the predetermined commands. Under the condition where such a gate means is open, direct read access can be made to the flash memory outside the data processing apparatus. The read command may be the command other than the predetermined commands described above. With this structure, the flash memory built-in in the data processing apparatus is equivalent, as seen from the external device such as a PROM writer, to a discrete flash memory (LSI device) in respect of rewrite and read operations.

(e) A procedure control program for rewriting the flash memory, which the central processing unit should execute, is stored in advance in the flash memory, and this program is transferred to a RAM in the data processing apparatus in response to setting of the rewrite operation mode by the external device. The program transferred to the RAM can be executed by the central processing unit.

(f) The quantity of the data to be stored in the flash memory is different depending on the usage of the data or on the kind of the data such as a program, a data table, control data, etc. When this fact is taken into consideration, it is better to allocate a plurality of kinds of memory blocks having mutually different memory capacities, as a simultaneously erasable unit in the flash memory, in order to eliminate wasteful write operations caused by simultaneous erasure of all memory blocks of the built-in flash memory for local or partial rewrite of the data held by the built-in flash memory after the data processing apparatus having the flash memory has been mounted onto the system (circuit board) to thereby improve rewrite efficiency.

According to the above-described structures, since the rewrite sequence is accomplished by built-in circuits of the data processing apparatus having the built-in flash memory, in accordance with commands given asynchronously from the external device, the external device has only to apply the commands to the data processing apparatus before it gives the apparatus data and address data, in the same way as it gives the data. And, data write in the built-in flash memory of the data processing apparatus can be effected by coupling (electrically connecting) the flash memory with the external device versatilely used such as a PROM writer, through a socket adapter.

The built-in central processing unit of the data processing apparatus controls the rewrite sequence designated by the commands, eliminates the necessity of exclusive circuits for the rewrite sequence control or reduces the number of such circuits, and accomplishes the reduction of the chip area of the data processing apparatus. Further, the control sequence for rewrite can be changed by modifying software that are to be executed by the central processing unit, and this makes it possible to set conditions such as a write time in a manner which matches with characteristics of the memory devices that constitute the flash memory.

BRIEF DESCRIPTION OF THE DRAWINGS

FIGS. 6A to 6C are timing charts showing an example of command write by a PROM writer.

FIG. 7 is a timing chart showing an example of a data write cycle for a flash memory by CPU control.

FIG. 10 is an overall block diagram of the flash memory built-in in the microcomputer shown in FIG. 8.

FIG. 11 is an explanatory view showing an example of the mode of division of a memory block.

FIGS. 12A to 12C are explanatory views showing examples of a control register and an erase block designation register.

FIGS. 19A and 19B are explanatory views showing altogether states of the flags at the time of reset by the PROM writer and the operation of the CPU.

DESCRIPTION OF PREFERRED EMBODIMENTS

Embodiments of the present invention will be described in the order of the items listed below.
[1] Principle of operation of a flash memory
[2] Division into a plurality of memory blocks having mutually different storage capacities
[3] Principle of command system data write in a flash memory by PROM writer
[4] Microcomputer
[5] Built-in flash memory
[6] Hardware adapted to command system
[7] Command specification of data write and others in a flash memory by PROM writer
[8] Data write in a flash memory in on-board state
[9] Data write operation by command system
[10] Operation of PROM writer for data write by command system
[11] Operation of CPU for data write by command system
[12] Compatibility between a flash memory built-in in a data processing apparatus and a discrete flash memory LSI in terms of write specification, as seen from PROM writer

[1] Principle of Operation of a Flash Memory

Figure 1A:
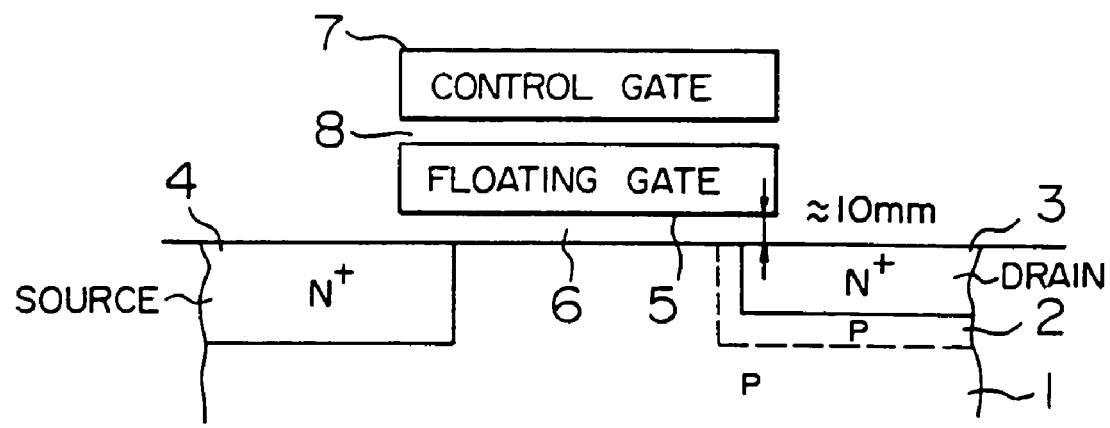
FIGS. 1A and 1B are diagrams for explaining a structure and the principle of operation of a flash memory.
Figure 1B:
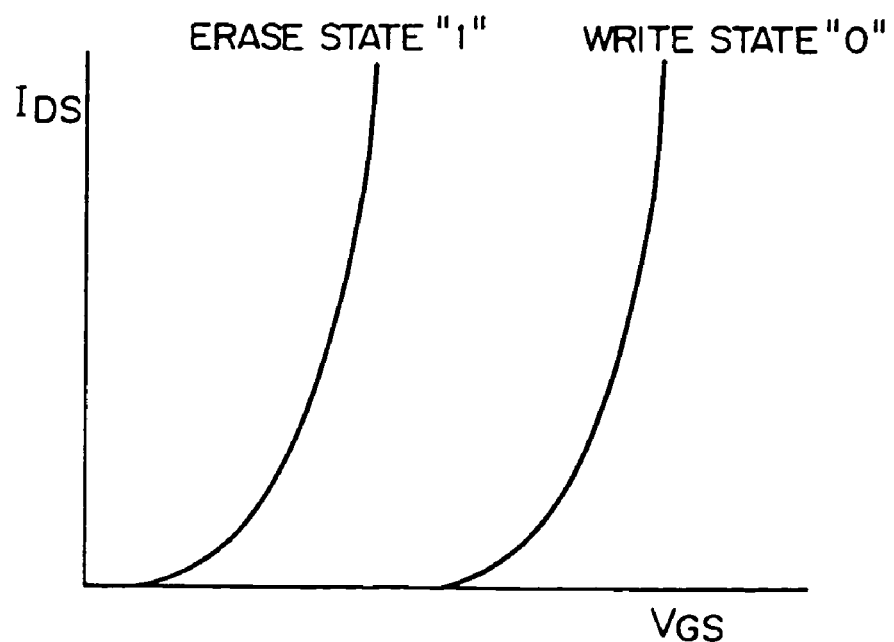

FIGS. 1A and 1B illustrate a structure and the principle of operation of a flash memory. A memory cell typically depicted in FIG. 1A comprises an insulated gate field effect transistor having a two-layered gate structure. In the drawing, reference numeral 1 denotes a P type silicon substrate, reference numeral 2 denotes a P type semiconductor region formed in the silicon substrate 1, and reference numerals 3 and 4 denote N type semiconductor regions. Reference numeral 5 denotes a floating gate formed on the P silicon substrate 1 through a thin oxide film 6 (10 nm-thick, for example) as a tunnel insulating film, and reference numeral 7 denotes a control gate formed on the floating gate 5 through the oxide film 8. A source is constituted by region 4 and a drain by region 3. Data stored in this memory cell is held substantially as a change of a threshold voltage by a transistor. Hereinafter, the description will be given on the case where the transistor for storing data (hereinafter also referred to as the "memory cell transistor") in the memory cell is of the N channel type unless specifically described otherwise.

The data write operation in the memory cell is accomplished, for example, by applying a high voltage to the control gate 7 and the drain and injecting electrons from the drain side to the floating gate by avalanche injection. Due to this write operation, the threshold voltage of the memory transistor, as viewed from its control gate 7, becomes higher than that of the memory transistor under an erase state, to which the write operation is not executed, as shown in FIG. 1B.

On the other hand, the erase operation is accomplished, for example, by applying a high voltage to the source and extracting the electrons from the floating gate 5 to the source side by the tunnel phenomenon. Due to this erase operation, the threshold voltage of the memory transistor as viewed from its control gate 7 is lowered as shown in FIG. 1B. In FIG. 1B, the threshold value of the memory cell transistor is set for a positive voltage level in both of the write and erase states. In other words, the threshold voltage under the write state is set to be higher than the word line selection level applied from a word line to the control gate 7 and the threshold voltage under the erase state is set to be lower. Since both of the threshold voltages and the word line selection level have such a relationship, the memory cell can be constituted by one transistor without using a select transistor in combination. To electrically erase the stored data, the electrons accumulated in the floating gate 5 are extracted to the source electrode. Since erase of the stored data is thus effected, a greater quantity of electrons than the quantity of the electrons injected into the floating gate 5 during the write operation are extracted if the erase operation is continued for a relatively long time. Accordingly, if over-erase is carried out such as when the electrical erase is continued for a relatively long time, the threshold voltage of the memory cell transistor changes to a negative level, for example, and there occurs the problem that the memory cell transistor is selected at a non-selection level of the word line, too. Incidentally, the write operation can be effected also by utilizing the tunnel current in the same way as the erase operation.

In the read operation, the voltages applied to the drain 3 and to the control gate 7 are limited to relatively low values so that a weak write is not made in the memory cell or in other words, undesired injection of carriers is not made in the floating gate 5. For example, a low voltage of above 1 V is applied to the drain and a low voltage of about 5 V is applied to the control gate 7. The logic values "0" and "1" of the data stored in the memory cell can be discriminated by detecting the magnitude of the channel current flowing through the memory cell due to these applied voltages.

Figure 2:
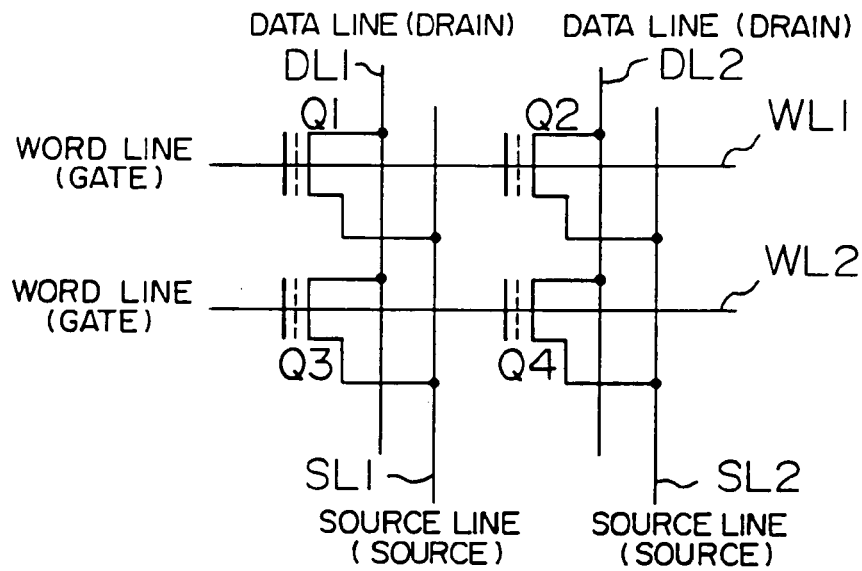
FIG. 2 is an explanatory view showing the structural principle of the flash memory for a memory cell array.

FIG. 2 shows the structural principle of a memory cell array using the memory cell transistors described above. This drawing, for purposes of the present discussion, illustrates a matrix arrangement of only four memory cell transistors Q1 to Q4. Among the memory cells arranged in matrix in X and Y directions, the control gates (selection gates of the memory cells) of the memory cell transistors Q1, Q2, (Q3, Q4) arranged on the same row are connected to a corresponding word line WL1 (WL2) and the drain regions (input/output nodes of the memory cells) of the memory cell transistors Q1, Q3 (Q2, Q4) disposed on the same column are connected to a corresponding data line DL1 (DL2). The source regions of the memory cell transistors Q1, Q3 (Q2, Q4) are connected to a source line SL1 (SL2).

Table 1 shows an example of voltage conditions for the erase and write operations for the memory cells.

TABLE 1

| OPERA-<br>TION<br>MODE | MEMORY<br>CELL | SELECT/<br>NON-SELECT | SOURCE | DRAIN | GATE |
|---|---|---|---|---|---|
| WRITE | Q1 | SELECT | 0V | 6 V | 12V |
| | Q2 | NON-SELECT | 0V | 0 V | 12V |
| | Q3 | NON-SELECT | 0V | 6 V | 0V |
| | Q4 | NON-SELECT | 0V | 0 V | 0V |
| ERASE<br>(1) | Q1, Q3 | SELECT | 12V | 0 V | 0V |
| | Q2, Q4 | NON-SELECT | 0V | 0 V | 0V |
| ERASE<br>(2) | Q1, 02 | SELECT | 5V | 0 V | −10V |
| | Q3, Q4 | NON-SELECT | 5V | 0 V | 0V |

ERASE (1): POSITIVE VOLTAGE SYSTEM ERASE OPERATION
ERASE (2): NEGATIVE VOLTAGE SYSTEM ERASE OPERATION

In Table 1, the term "memory cell" means a memory cell transistor and the term "gate" means the "control gate" of the memory cell transistor as the selection gate. In Table 1, the erase operation by a negative voltage system is accomplished by applying a negative voltage of −10 V, for example, so as to generate a high electric field necessary for erase. As can be understood clearly from Table 1, simultaneous erase can be made in the erase operation of a positive voltage system for those memory cells at least the sources of which are connected in common. According to the structure shown in FIG. 2, therefore, the four memory cells Q1 to Q4 can be simultaneously erased if the source lines SL1 and SL2 are connected. In this case, the size of the memory block can be set for an arbitrary size by changing the number of memory cell transistors connected to the same source line. Besides the case using the data line as a unit as typically shown in FIG. 2 (the case where the common source line is extended in the direction of the data line), a source line division system includes also a case using the word line as a unit (the case where the common source line is extended in the direction of the word line). On the other hand, simultaneous erase can be made for those memory cells the control gates of which are connected in common, in the erase operation of the negative voltage system.

Figure 3:
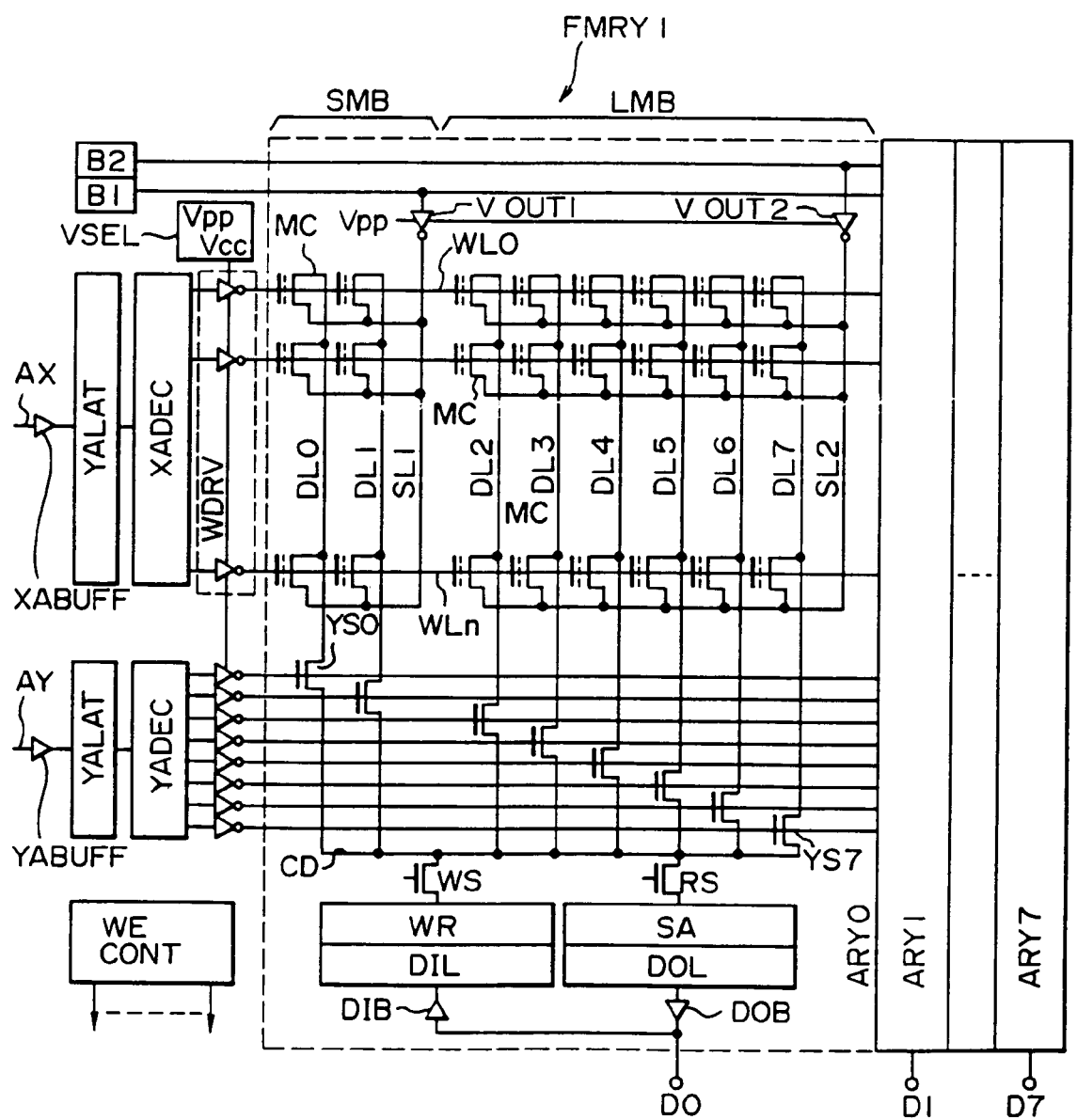
FIG. 3 is an exemplary block circuit diagram of a flash memory in which the memory capacity of simultaneously erasable memory blocks is made mutually different.

[2] Division into a Plurality of Memory Blocks Having Mutually Different Memory Capacities FIG. 3 is a block circuit diagram showing an example of a flash memory including memory blocks which are simultaneously erasable and have mutually different memory capacities.

The flash memory FMRY1 shown in FIG. 3 has 8-bits data input/output terminals D0 to D7, and is equipped with memory cell arrays ARY0 to ARY7 for each data input/output terminal. Each of the memory cell arrays ARY0 to ARY7 is divided into a memory block LMB having a relatively large memory capacity and a memory block SMB having a relatively small memory capacity, though this arrangement is not particularly limitative. The diagram particularly illustrates details of the memory cell array ARY0 as a typical example, but the other memory cell arrays ARY1 to ARY7, too, have a similar structure.

In each of the memory arrays ARY0 to ARY7, memory cells MC each comprising an insulated gate field effect transistor having the two-layered gate structure explained with reference to FIGS. 1A and 1B are arranged in matrix. In FIG. 3, symbols WL0 to WLn represent word lines which are in common to all the memory cell arrays ARY0 to ARY7. The control gates of the memory cells disposed on the same row are connected to the corresponding word line. In each of the memory arrays ARY0 to ARY7, the drain regions (first main electrodes) of the memory cells MC disposed on the same column are connected to the corresponding data line DL0 to DL7. The source regions (second main electrodes) of the memory cells MC constituting the memory block SMB are connected in common to the source line SL1, and the source regions of the memory cells MC constituting the memory block LMB are connected in common to the source line SL2.

A high voltage Vpp utilized for erase is supplied from voltage output circuits VOUT1, VOUT2 to the source lines SL1, SL2 described above. The operation of the voltage output circuits VOUT1, VOUT2 is selected in accordance with the value of bits B1, B2 of an erase block designation register. For example, when "1" is set for the bit B1 of the erase block designation register, only the small memory blocks SMB of the memory cell arrays ARY0 to ARY7 can be simultaneously erased. When "1" is set for the bit B2 of the erase block designation register, only the large memory blocks LMB of the memory cell arrays ARY0 to ARY7 can be simultaneously erased. When "1" is set for both of the bits B1 and B2, the flash memory can be simultaneously erased as a whole.

Selection of the word lines WL0 to WLn described above is effected when an X address decoder XADEC decodes an X address signal AX fetched through an X address buffer XABUFF and an X address latch XALAT. A word driver WDRV drives the word line on the basis of a select signal outputted from the X address decoder XADEC. In the data read operation, the word driver WDRV is operated using a voltage Vcc such as 5 V supplied from a voltage select circuit VSEL and a ground potential such as 0 V as the power source, drives the to-be-selected word line to the select level by the voltage Vcc and keeps the word line, which is not to be selected, at a non-select level such as 0 V. In the data write operation, the word driver WDRV is operated using a voltage Vpp such as 12 V supplied from a voltage selection circuit VSEL and the ground potential such as 0 V as the power source, and drives the to-be-selected word line to a high voltage level for writing such as 12 V. In the data erase operation, the output of the word driver WDRV is set to a low voltage level such as 0 V. In each of the memory cell arrays ARY0 to ARY7, the data lines DL0 to DL7 are connected in common to the common data line CD through Y select switches YS0 to YS7. Switch control of the Y select switches YS0 to YS7 is effected when the Y address decoder YADEC decodes a Y address signal AY fetched through the Y address buffer YABUFF and the Y address latch YALAT. The output select signal of the Y address decoder YADEC is supplied in common to all the memory cell arrays ARY0 to ARY7. Accordingly, when any one of the output select signals of the Y address decoder YADEC is set for the select level, the common data line CD is connected to one data line in each of the memory cell arrays ARY0 to ARY7.

The data read out from the memory cell MC to the common data line CD is applied to a sense amplifier SA through the select switch RS, is amplified by this sense amplifier, and is then outputted outside from a data output buffer DOB through a data output latch DOL. The select switch RS is set for the select level in synchronism with the read operation.

The write data supplied from outside is held by a data input latch DIL through a data input buffer DIB. When the data latched by the data input latch DIL is "0", the write circuit WR supplies a high voltage for write to the common data line CD through the select switch WS. This high voltage for write is supplied through the data line selected by the Y address signal AY to the drain of the memory cell receiving the high voltage at the control gate thereof by the X address signal AX. In this way, this memory cell is written. The select switch WS is set for the select level in synchronism with the write operation.

Various timings for write/erase and select control of the voltage are generated by a write/erase control circuit WECONT.

There is a case where the data quantity to be stored in the flash memory FMRY1 is different depending on the usage of data and on the kinds of the data such as a program, a data table, a control data, and so forth. In consideration of such a case, a plurality of memory blocks SMB, LMB having mutually different storage capacities are provided as a simultaneously erasable unit in the flash memory. According to such a construction, any waste of the write operation undesirably caused by simultaneous erase of all the memory blocks for local or partial rewrite of the stored data of the flash memory built-in in the microcomputer after the microcomputer has been mounted onto a circuit board, can be eliminated to improve the write efficiency.

[3] Principle of Data Write in a Flash Memory by Command System by PROM Writer

Figure 4:
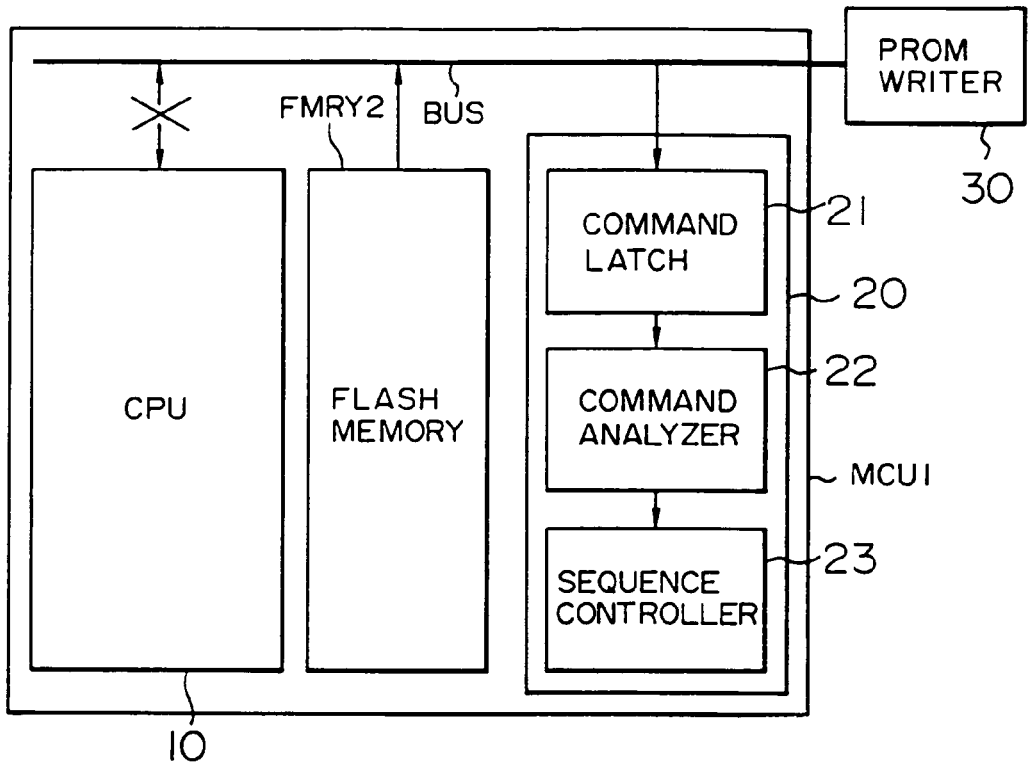
FIG. 4 is a functional block diagram of a microcomputer having a built-in flash memory according to a first embodiment, in which a rewrite processing of the built-in flash memory is executed by a PROM writer.

FIG. 4 is a functional block diagram when the built-in flash memory of the microcomputer MCU1 (which may be formed in a single semiconductor substrate) having the flash memory FMR2, according to the first embodiment of the present invention, is subjected to a rewrite processing by a PROM writer.

FIG. 4 illustrates the central processing unit (hereinafter also referred to merely as "CPU") 10, the flash memory FMRY2 and the control circuit 20 as exemplary circuit modules sharing the internal bus BUS. This microcomputer MCU1 has a write operation mode by use of the PROM writer 30. For example, when the microcomputer MCU1 is connected to predetermined terminals of the PROM writer 30 through a socket adapter, not shown, the mode setting terminal, not shown, of the microcomputer MCU1 is compulsively set for a predetermined level, so that the operation mode of the microcomputer MCU1 is set for the write mode by the PROM writer 30 (ROM writer write mode operation). In such an operation mode, the CPU 10 is cut off from the internal bus BUS through a bus switch, not shown. In a state where the write operation mode is set by the PROM writer 30, the control circuit 20 includes command latch 21 which is made writable from the PROM writer 30 and serves to latch a command supplied from the PROM writer, command analyzer 22 for analyzing (i.e., decoding) the command latched in the command latch, and sequence controller 23 for executing sequence control for rewriting of the flash memory in accordance with the analyzed content. The PROM writer 30 supplies predetermined commands such as erase, erase verify, program (write), program verify, etc., and successively supplies necessary data and address data to the control circuit 20. The command supplied from the PROM writer 30 is interpreted by the command analyzer 22 and the sequence controller 23 applies to the flash memory FMRY2 a control signal for a write operation utilizing the necessary data and address data in accordance with the interpretation by the analyzer 22.

As has been described above, the rewrite (erase and write) sequence in accordance with commands given from the PROM writer 30 can be accomplished by the control circuit 20 included in the microcomputer MCU1 by having the PROM writer 30 only to supply commands, before supply of data and address information, to the microcomputer MCU1 in the same way as the PROM writer 30 supplies the data thereto. Accordingly, by connecting microcomputer MCU1 to the PROM writer 30 which is generally utilized, through a socket adapter, data can be written to the flash memory FMRY2 built-in in the microcomputer. In this construction, the microcomputer MCU1 in which the write mode by the PROM writer 30 is set can be regarded as identical with a discrete flash memory chip by the PROM writer 30.

Figure 5:
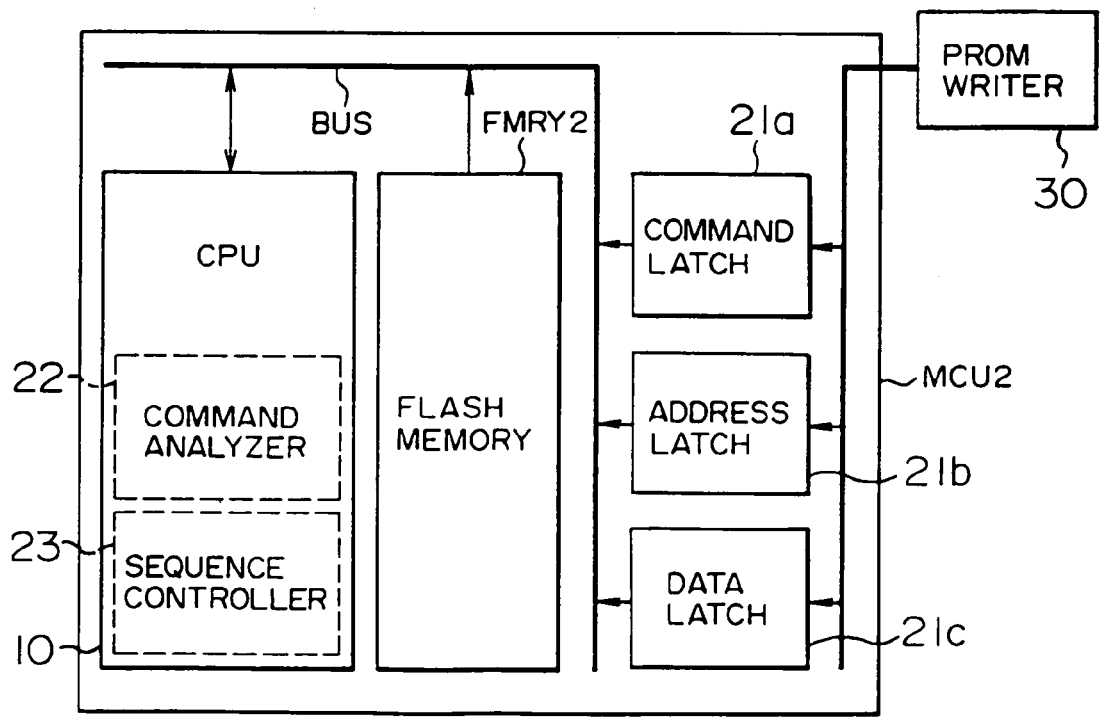
FIG. 5 is a functional block diagram of a microcomputer having a built-in flash memory according to a second embodiment, in which a rewrite processing of the built-in flash memory is executed by a PROM writer.

FIG. 5 shows a functional block diagram of a microcomputer MCU2 (which may be formed in a single semiconductor substrate) having the flash memory FMRY2 built-in according to a second embodiment, in which a rewrite processing is executed for the built-in flash memory MRY2 by the PROM writer 30.

The microcomputer MCU2 shown in FIG. 5 eliminates the exclusive circuits for rewrite, such as the command analyzer 22 and the sequence controller 23, by allowing the built-in CPU 10 to execute the command analysis and the sequence control without the control circuit 20. In FIG. 5, since the CPU 10 is cut off from the internal bus BUS during the write mode by the PROM writer 30, there is no necessity for the built-in CPU 10 to execute a different processing during the rewrite operation of the flash memory FMRY2 by the PROM writer 30, and therefore, it may be highly possible that the CPU 10 is at halt or dormant, due to the disconnection from the internal bus. The structure shown in FIG. 5 efficiently utilizes such built-in CPU 10.

FIG. 5 typically shows the CPU 10, the flash memory FMRY2 and the command latches 21a to 21c as the circuit modules sharing the internal bus BUS. This microcomputer MCU2 has a write mode by the PROM writer 30. For example, when the microcomputer MCU2 is connected to the predetermined terminals of the PROM writer 30 through the socket adapter, not shown, the mode setting terminal of the microcomputer MCU2, not shown, is compulsively set for the predetermined level, and the write mode by the PROM writer 30 is set. The PROM writer 30 is disconnected from the internal bus BUS so as not to directly supply the data and the address information to the internal bus so that the supplied information do not conflict with the internal bus access by the CPU 10; however, the construction is not particularly limited thereto. The command, data and the address information are written in the command latch 21a, data latch 21b and the address latch 21c, respectively. The CPU 10 realizes, in the write operation mode by the PROM writer 30, a function of the command analyzer 22 for analyzing the command written from the PROM writer 30 and a function of the sequence controller 23 for executing the sequence control for rewriting the flash memory FMRY2 in accordance with the analyzed content, as well as a control program for the functions. The PROM writer 30 supplies to the latches 21a to 21c predetermined commands such as erase, erase verify, program (write), program verify, etc, and successively supplies the necessary data information and address information. The command supplied from the PROM writer 30 is interpreted by the CPU 10, and the CPU 10 sends a control signal for the write operation to the flash memory FMRY2 by utilizing the necessary data information and address information written in the address latch 21b and data latch 21c.

FIGS. 6A to 6C show an example of a command write timing by the PROM writer 30. In FIG. 6A, the cycle labeled "command write cycle" is the write cycle by the PROM writer 30 into the microcomputer MCU2. First, the command is written in the command latch 21 and then, the data information and the address information are written in the data latch 21c and the address latch 21b, respectively, whenever necessary. In FIG. 6A, the cycle labeled "write cycle" is the data information write cycle into the flash memory which is executed under the CPU control in accordance with the content written by the PROM writer 30.

FIG. 7 shows an exemplary timing of the data write cycle into the flash memory by the CPU control. This write cycle includes a cycle of the command analysis by the CPU 10, a write cycle executed for actual write in the flash memory in accordance with the command analysis result and a cycle of post-processing.

The microcomputer MCU2 according to the second embodiment, too, is capable of writing data in the flash memory FMRY2 built-in in the microcomputer by connecting the PROM writer 30, which is generally utilized, through the socket adapter in the same way as in the first embodiment. Further, since the CPU 10 controls the sequence for rewrite designated by the command, an exclusive circuit or circuits for this control can be eliminated or reduced, and the chip area of the microcomputer MCU2 can also be reduced. Because the control sequence for rewrite is changeable by the software to be executed by the CPU 10, a condition such as the write time can be set in accordance with the characteristics of the memory cell transistors constituting the flash memory FMRY2. A comparison between the first embodiment and the second embodiment show differences such as listed in Table 2.

TABLE 2

| ITEM | 2ND EMBODIMENT (CPU CONTROL) | 1ST EMBODIMENT (HARDWARE CONTROL) |
|---|---|---|
| SCALE OF CONTROL CIRCUIT | 300 Trs. | 3,200 Trs. |
| CHANGES OF COMMAND SPECIFICATION | SOFTWARE CHANGES | MASK CHANGES |

TABLE 2-continued

| ITEM | 2ND EMBODIMENT (CPU CONTROL) | 1ST EMBODIMENT (HARDWARE CONTROL) |
|---|---|---|
| CHANGES OF WRITE/ERASE CONDITIONS | SOFTWARE CHANGES | MASK CHANGES |

[4] Microcomputer

Figure 8:
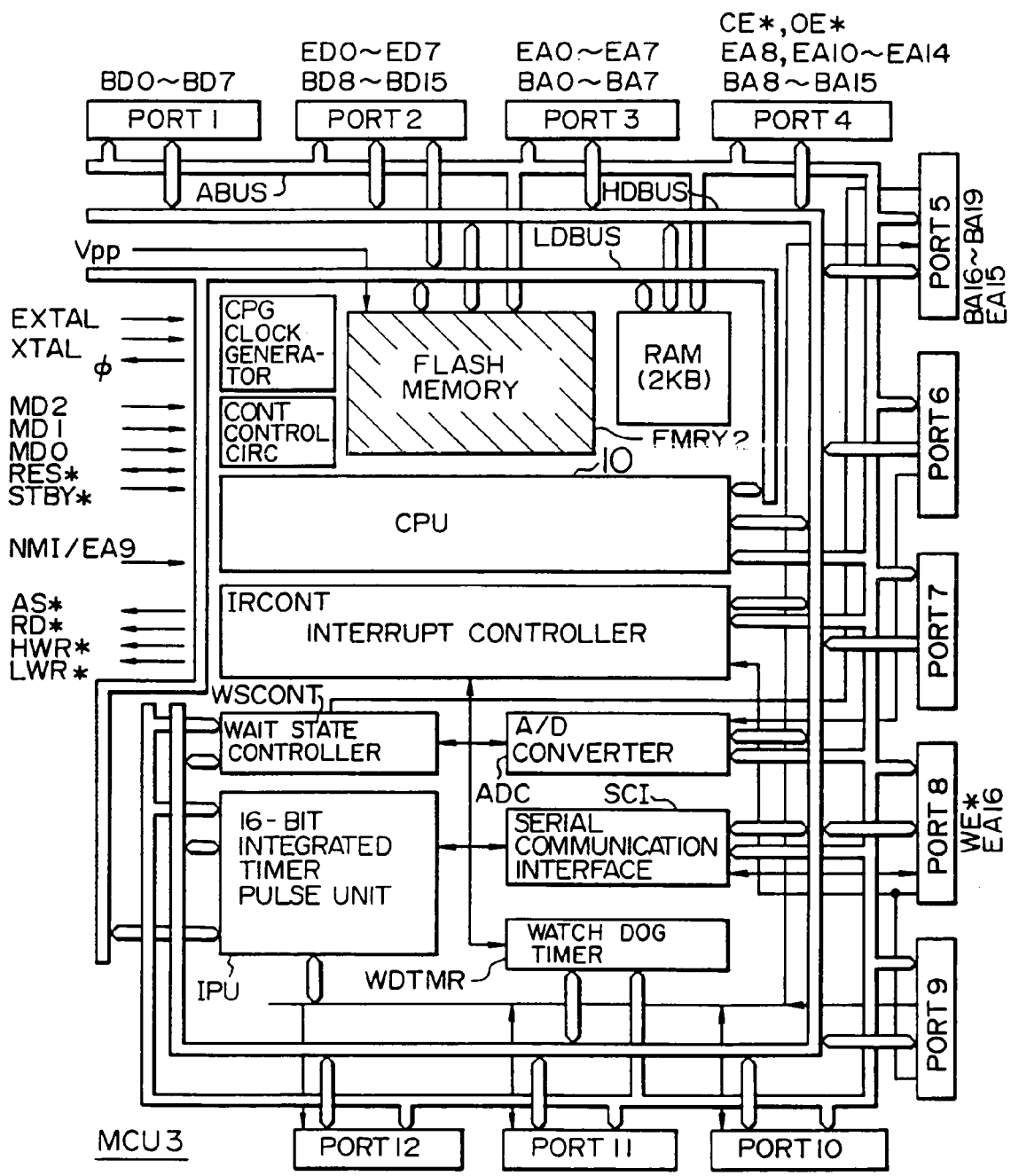
FIG. 8 is a block diagram showing details of a structure of a microcomputer corresponding to the microcomputer shown in FIG. 5.

FIG. 8 is a block diagram showing details of a microcomputer MCU3 corresponding to the microcomputer shown in FIG. 5.

The microcomputer MCU3 shown in FIG. 8 includes the CPU 10, the flash memory FMRY2, a serial communication interface SCI, the control circuit CONT, a random access memory RAM, a 16-bit integrated timer/pulse unit IPU, a watch-dog timer WDTMR, ports PORT1 to PORT12, a clock generator CPG, an interrupt controller IRCONT, an analog/digital converter ADC and a wait state controller WSCONT. These circuit modules are formed in a single semiconductor substrate such as a silicon substrate by a known semiconductor integrated circuit fabrication technique, although not to be considered as being limited thereto.

The CPU 10, the flash memory FMRY2, the random access memory RAM and the 16-bit integrated timer/pulse unit IPU are connected to the address bus ABUS, to a low order data bus LDBUS (e.g. 8 bits) and to a high order data bus HDBUS (e.g. 8 bits). The serial communication interface SCI, the watch-dog timer WDTMR, the interrupt controller IRCONT, the analog/digital converter ADC, the wait state controller WSCONT and the ports PORT1 to PORT12 are connected to the address bus ABUS and to the high order data bus HDBUS.

In FIG. 8, Vpp denotes a high voltage for rewriting the flash memory FMRY2. EXTAL and XTAL denote signals applied from an oscillator, which is externally connected to the chip of the microcomputer MCU3 and is not shown in the drawing, to the clock generator CPG described above. φ denotes a sync clock signal outputted outside from the clock generator CPG. RES* (symbol * represents that the signal with this asterisk is a low enable signal) is a reset signal, and STBY* denotes a standby signal, and is supplied to the CPU 10 and to other circuit blocks. NMI denotes a non-maskable interrupt signal, and applies a non-maskable interrupt to the interrupt controller IRCONT. Other interrupt signals not shown are given to the interrupt controller IRCONT through the ports PORT8 and PORT 9. AS* denotes an address strobe signal representing effectiveness of the address signal outputted outside, RD* denotes a read signal notifying to the outside that the operation cycle is the read cycle, HWR* denotes an upper byte write signal notifying to the outside that the operation cycle is the write cycle of the high order 8 bits, and LWR* denotes a lower byte write signal notifying to the outside that the operation cycle is the write cycle of the low order 8 bits. These signals are used as the access control signals of the microcomputer MCU3 to the outside.

MD0 to MD2 denote mode signals which are supplied to the control circuit CONT so as to set the operation mode of the microcomputer MCU3. The operation modes set by such mode signals include, though not particularly limitative, an operation mode relating to the address space the CPU can manage, such as a maximum mode and a minimum mode, and an operation mode which makes it possible for the PROM writer 30 to write data to the built-in flash memory FMRY2 (which will be merely called the "PROM writer write mode"). In contrast with this PROM writer write mode, the maximum mode and the minimum mode described above can be understood to mean the operation modes in which the CPU 10 makes the built-in flash memory FMRY2 rewritable in the on-board state of the microcomputer MCU3.

In the operation modes other than the operation mode in which the data or information is written in the flash memory FMRY2 by the PROM writer 30 in accordance with the command system, the ports PORT1 and PORT2 are allocated to the input/output operation of the data BD0 to BD15 by the microcomputer MCU3 in order to make an access to the outside, though this arrangement is not particularly limitative. The ports PORT3 to PORT5 are allocated to the output operation of the address signals BA0 to BA19 at this time, though this arrangement is not particularly limitative, either.

On the other hand, when the PROM writer write mode is set in the microcomputer MCU, the ports PORT2 to PORT5 and PORT8 are allocated to the connection with the PROM writer 30 for the rewrite control of the flash memory FMRY2 at this time, though this arrangement is not particularly limitative. In other words, the port PORT2 is allocated to command write and to input/output of data ED0 to ED7 for data write and write verify, and the ports PORT3 to PORT5 and PORT8 are allocated to input of the address signal EA0 to EA16 and to input of the access control signals CE* (chip enable signal), OE* (output enable signal) and WE* (write enable signal). The chip enable signal CE* is a chip select signal from the PROM writer 30, the output enable signal OE* is an instruction signal of the output operation for the microcomputer MCU3, and the write enable signal WE* is an instruction signal of the write operation for the microcomputer MCU3. By the way, the input terminal of the signal NMI is allocated to the input of one bit EA9 among the address signals EA0 to EA16. The external terminals of the ports allocated in this way and other necessary external terminals such as the terminal of the high voltage Vpp application are connected to the PROM writer 30 through the socket adapter as a socket for changing the pin arrangement, which is not shown in the drawing. The group of external terminals of the microcomputer MCU3 which are allocated to the connection with the PROM writer 30 in the PROM writer write mode are allocated to other functions in other operation modes.

Figure 9:
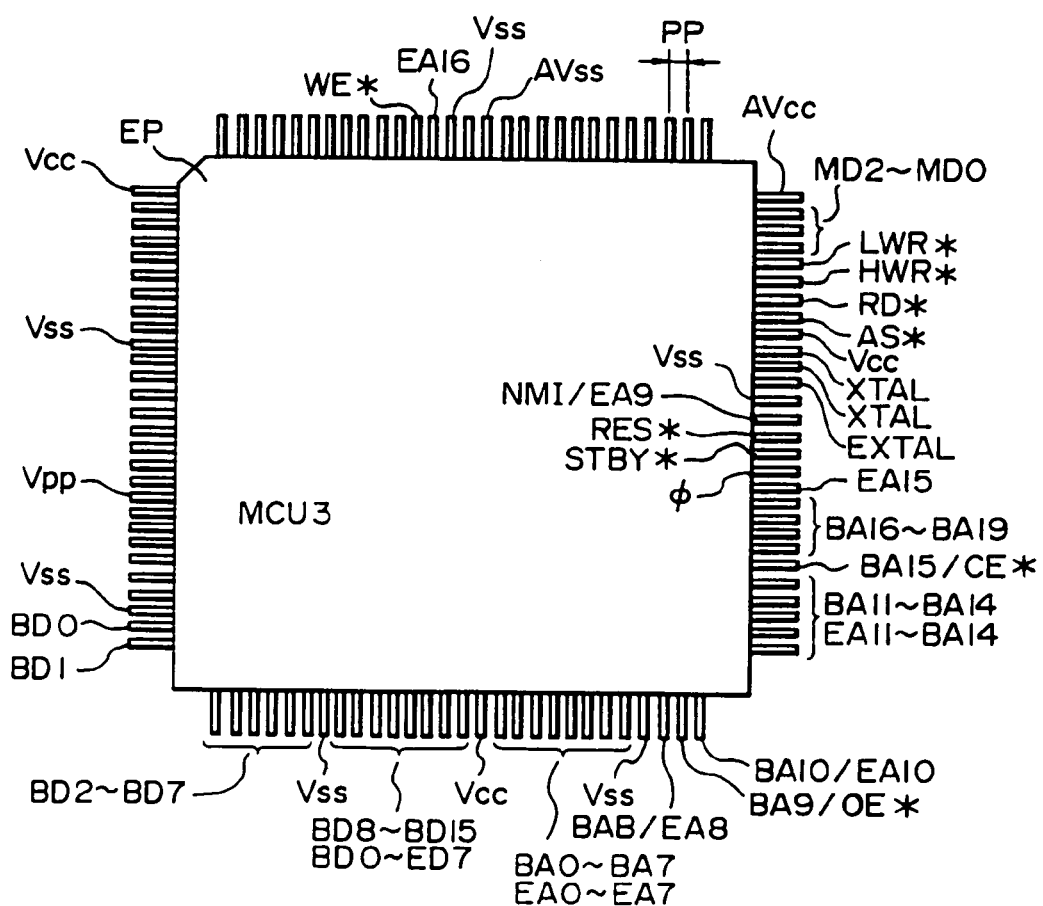
FIG. 9 is a plan view showing the microcomputer shown in FIG. 8 in a packaged state.

FIG. 9 shows an upper surface of a package which is obtained by molding the microcomputer MCU3 shown in FIG. 8 by a resin, for example, and which has external terminals on the four sides thereof. The signals shown in FIG. 9 are common to those shown in FIG. 8. The external terminals (pins) to which the names of signals are not given are utilized as an input pin for a wait signal, an input pin for a bus request signal, an output pin for a bus acknowledge signal, signal input/output pins between the peripheral circuits such as the serial communication interface SCI and the outside, and so forth.

[5] Built-in Flash Memory

FIG. 10 is an overall block diagram of the flash memory FMRY2 built-in in the microcomputer MCU3 shown in FIG. 8. In the drawing, ARY represents a memory cell array constituted by arranging, in matrix, memory cells each comprising an insulated gate field effect transistor of the two-layered structure explained with reference to FIG. 1A. In this memory cell array ARY, the control gate of each memory cell is connected to the corresponding word line, the drain region of the memory cell is connected to the corresponding data line and the source region of the memory cell is connected to the common source line for each memory block in the same way as in the structure which has been explained with reference to FIG. 3. However, the mode of division of the memory cell blocks may be different from that shown in FIG. 3. As shown in FIG. 11, for example, it is divided into seven large memory blocks (large blocks) LMB0 to LMB6 having relatively large storage capacities and eight small memory blocks (small blocks) SMB0 to SMB7 having relatively small storage capacities. Each large memory block is utilized for a program storage region or a large capacity data storage region. Each small memory block is utilized for a small capacity data storage region.

In FIG. 10, AIL denotes a latch circuit for the address signals PAB0 to PAB15. The address signals PAB0 to PAB15 correspond to the output address signals delivered to the address bus ABUS from the CPU 10, and also correspond to the output address signals EA0 to EA15 of the PROM writer 30 in the PROM writer write mode, respectively. XADEC denotes the X address decoder which decodes the X address signal fetched through the address latch AIL. The word driver WDRV drives a word line on the basis of the select signal outputted from the X address decoder XADEC. In the data read operation, the word driver drives the word line with a voltage such as 5 V and in the data write operation, it drives the word line with a high voltage such as 12 V. In the data erase operation, all the outputs of the word drivers are set for a low voltage level such as 0 V.

YADEC denotes a Y address decoder for decoding the Y address signal fetched through the address latch AIL. YSEL denotes a Y selector for selecting the data line in accordance with the output select signal of the Y address decoder YADEC. SA denotes a sense amplifier for amplifying the read signal from the data line selected by the Y selector YSEL in the data read operation. DOL denotes a data output latch for holding the output of the sense amplifier SA. DOB denotes a data output buffer for outputting outside the data held by the data output latch DOL.

In FIG. 10, PDB0 to PDB7 denote low order eight-bit (one byte) data and PDB8 to PDB15 denote high order eight-bit (one byte) data. According to this embodiment, the output data is maximum two bytes. DIB denotes a data input buffer for fetching the write data supplied from outside. The data fetched from the data input buffer DIB is held by the data input latch DIL. When the data held by the data input latch DIL is "0", the write circuit WR supplies a high voltage for write to the data line selected by the Y selector YSEL. This high voltage for write is supplied to the drain of the memory cell, to the control gate of which a high voltage is applied, in accordance with the X address signal, so that this memory cell is written.

EC denotes an erase circuit for simultaneously erasing the memory blocks by supplying an erase high voltage to the source line of the designated memory blocks. Designation of the erase blocks for the erase circuit EC is made by an erase block designation register MBREG. Writing of data in this register MBREG is carried out by the CPU10.

FCONT denotes a controlling circuit for selectively controlling the timing of the data readout operation in the flash memory FMRY2, various timings for write and erase and selection of voltages. The controlling circuit FCONT includes an erase block designation register MBREG and a control register CREG. This controlling circuit FCONT executes these processings by referring to the content of the control register CREG. In FIG. 10, the registers MBREG and CREG are shown outside the block of the circuit FCONT for convenience sake.

FIGS. 12A to 12C show examples of the control register CREG and the erase block designation register MBREG described above. This erase block designation register MBREG comprises two registers MBREG1 and MBREG2, and each of the registers MBREG1, MBREG2 is an eight-bit register. In the control register CREG, Vpp denotes a high voltage application flag which is set for "1" for application of the high voltage for rewrite. E bit is a bit designating the erase operation, and EV bit is a designation bit of a verify operation at the time of an erase operation. P bit is a designation bit of the verify operation at the time of the write operation (program operation), and PV bit is a designation bit of the verify operation at the time of a write operation. The erase block designation registers MBREG1, MBREG2 are the registers which designate which of memory blocks contained in the large memory blocks divided into the seven blocks and in the small memory blocks divided into the eight blocks should be erased. The bits from the 0th bit to the seventh bit are designation bits for each memory block. For example, the bit "1" means the selection of the corresponding memory block and the bit "0" means non-selection of the corresponding memory block. When the seventh bit of the erase block designation register MBREG2 is "1", for example, erase of the small memory block SMB7 is designated.

The registers CREG, MBREG1, MBREG2 are made readable and writable by the CPU 10.

The controlling circuit FCONT refers to the set contents of the registers CREG, MBREG1, MBREG2 and executes erase and write. The CPU 10 can control the erase and write operations by rewriting the contents of the registers CREG, MBREG1, MBREG2. When the PROM writer write mode described already is set, for example, the CPU 10 sets the registers CREG, MBREG1, MBREG2 in accordance with the contents of the commands written in the command latch by the PROM writer 30.

In FIG. 10, FLM, MS-FLN, MS-MISN, M2RDN, M2WRN, MRDN, NWRN, IOWORDN, RST, VPPH, A9H, SECSN, SECN, DSCN and XMON are supplied as the control signals to the controlling circuit FCONT.

The control signal FLM is the signal which designates the operation mode of the flash memory FMRY2, and is set for the logic value "1" when the microcomputer MCU3 is connected to the PROM writer 30 and is made rewritable, and for the logic value "0" at other times. This signal FLM is generated on the basis of the mode signals MD0 to MD2 described above, for example. The control signal MS-FLN is the select signal for selection of the flash memory FMRY2. The control signal MS-MISN is the select signal of the registers CREG, MBREG1, MBREG2. Which of these registers CREG, MBREG1, MBREG2 should be selected is decided by the low order two bits (PAB0 and PAB1) of the address signal outputted from the CPU 10, M2RDN denotes the memory read strobe signal, M2WRN denotes the memory write strobe signal, MRDN denotes the read signal for reading from the control register CREG, MWRN denotes the write signal for writing in the control register CREG. The memory write strobe signal M2WRN is regarded as the strobe signal for writing the data, which is to be written in the memory cells, in the data input latch DIL. The practical write operation into the memory cells is started when the P bit of the control register CREG is set. The control signal IOWORDN denotes a switch signal of the eight-bit read access and the sixteen-bit read access for the flash memory FMRY2. The control signal RST denotes a reset signal of the flash memory FMRY2. When this signal RST resets the flash memory FMRY2 or when the Vpp flag of the control register CREG is set for "0", each mode setting bit of EV, PV, E and P in the register CREG is cleared. VPPH denotes a detection signal indicating that Vpp=12 V is detected. By the way, other signals A9H, SECN, DSCN and XMON are enable signals and test enable signals of the security bits, and since they are not directly relevant to the present invention, their detailed explanation will be omitted.

[6] Hardware Adapted to Command System

Figure 13:
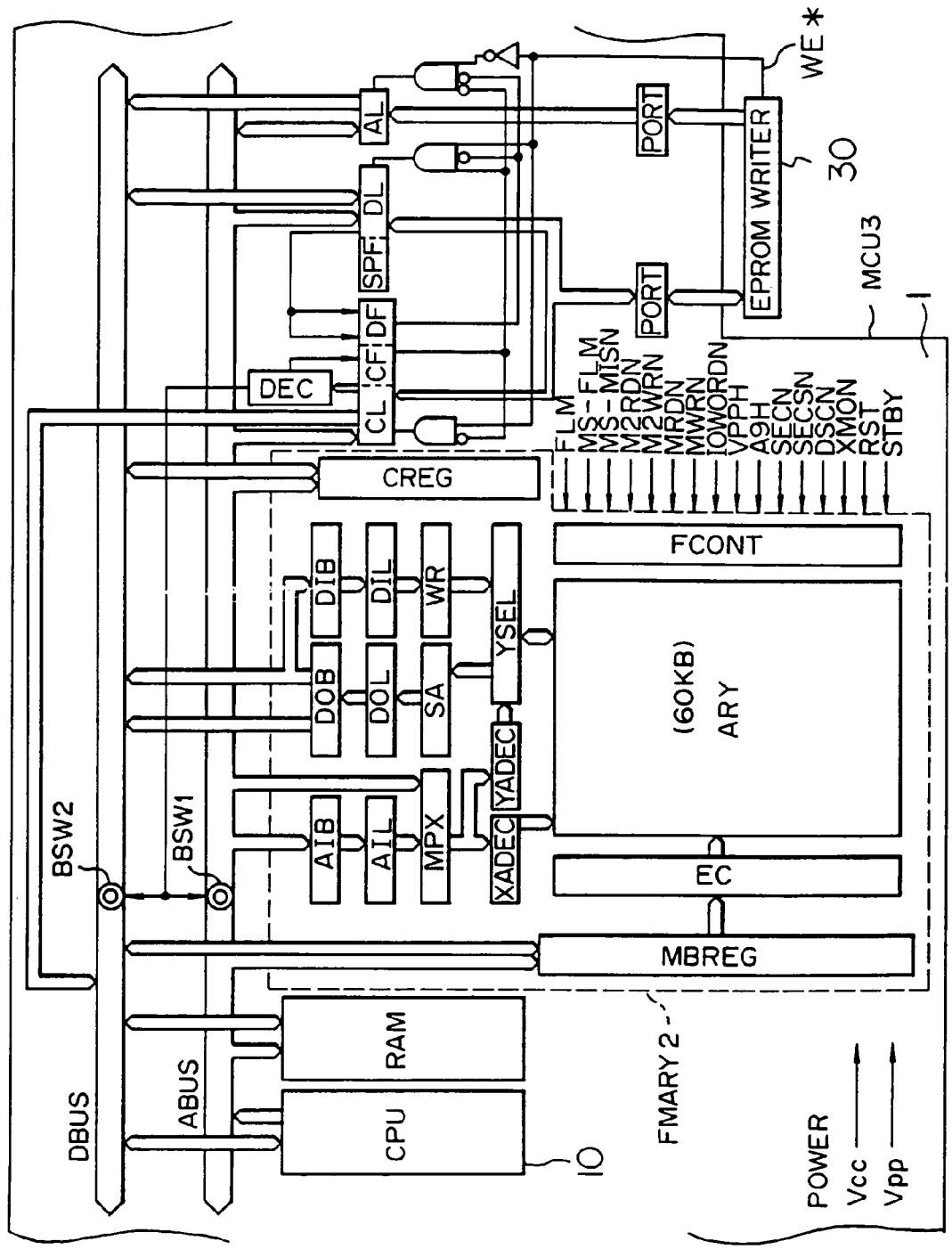
FIG. 13 is a block diagram showing details of hardware to cope with a PROM writer rewrite mode by a command system in the microcomputer shown in FIG. 8.

FIG. 13 shows details of hardware for facilitating the PROM writer rewrite mode by the command system in the microcomputer shown in FIG. 8. The hardware are implemented within a single semiconductor substrate 1.

The command and the address that are supplied from the PROM writer 30 are asynchronously inputted with respect to the CPU 10. Therefore, the command latch CL for receiving the command and the address latch AL for receiving the address are provided. The port PORT to be connected to the PROM writer 30 is primarily determined through the socket adapter, not shown in the drawing. When the port PORT has a register, the register can be used as the address latch AL and the command latch CL, and they may not be provided separately. A command flag CF is allocated to a predetermined bit of the command latch CL so that the CPU 10 can recognize write of the command into the command latch CL. When the command flag CF is set up, the CPU 10 can know that the command is inputted to the command latch CL, and then reads the command. In the write operation by the PROM 30, the write operation of the command is first made and then, the address and the data are written in the address latch AL and the data latch from the PROM writer 30, whenever necessary. At this time, since the time from the command input to the data input is as short as minimum 20 ns, there may be a case where the data is inputted to the command latch CL before the CPU 10 reads the command. Therefore, to avoid collision between the command and the data, the data latch DL for receiving the data is provided besides the command latch CL. Further, a data flag DF representing that the data is inputted to the data latch DL is allocated to a predetermined bit of the command latch. In the case of CF=1 (representing that the command has already been inputted) or DF=1 (representing that the command has already been inputted and furthermore, the data has also been inputted already), the CPU 10 reads the command, and reads the data after recognition of the command in the case of DF=1.

Here, the two latches, that is, the command latch CL and the data latch DL, share the data input/output port PORT. Therefore, the command and the data inputted from the PROGM writer 30 must be discriminated. For this reason, the input data from the PROM writer 30 is latched in the command latch CL when CF=0 and DF=0, and is latched in the data latch DL when CF=1 and DF=0. In other words, as shown conceptually in FIG. 13, there is provided an AND gate AND which receives the signal corresponding to the logic values of the write signal WE*, the command flag CF and the data flag DF from the PROM writer 30 and generates latch control signals.

Figure 14:
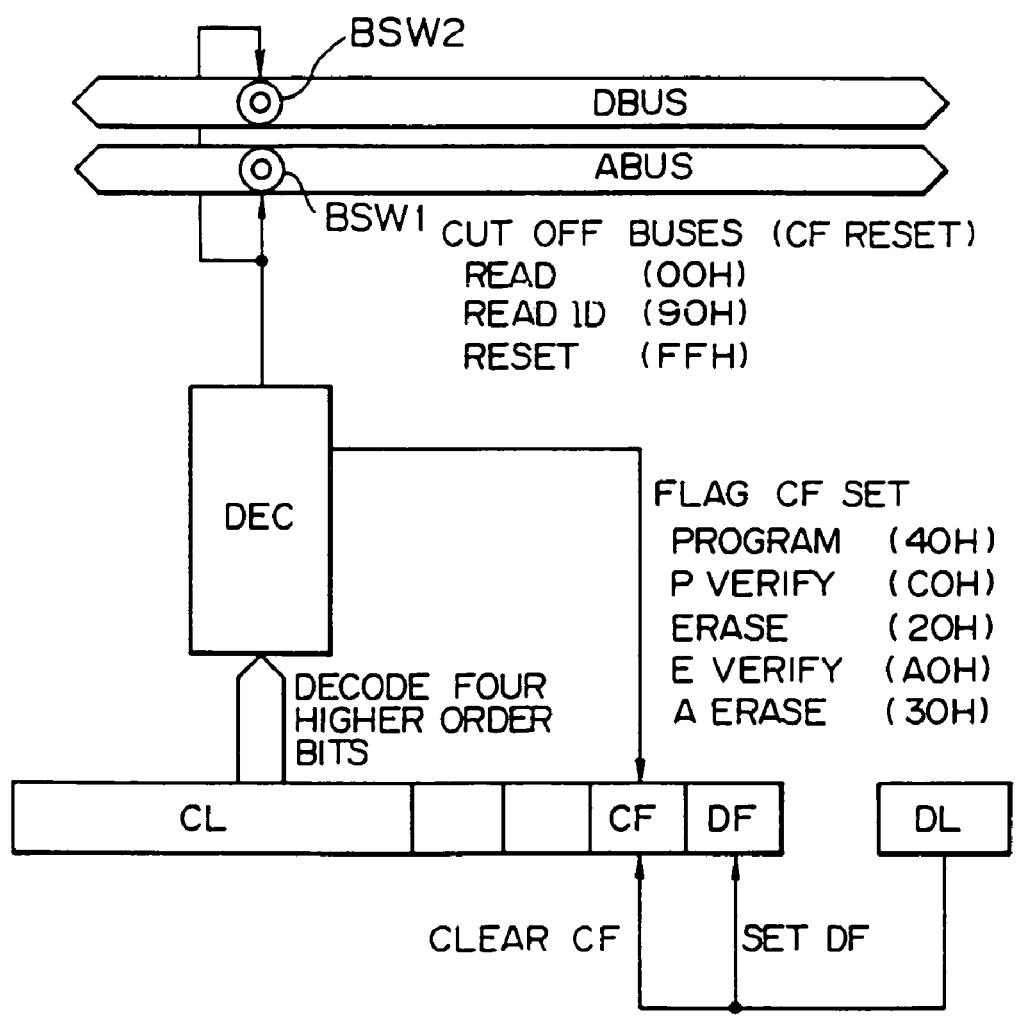
FIG. 14 is an explanatory view showing a control form of a command flag, a data flag and bus switches.

Further, as shown in FIG. 14, too, this embodiment employs the logic such that the kind of the command latched by the command latch CL is decoded by the decoder DEC, the command flag CF is set when the command is a predetermined command, and the data flag DF is set and moreover, the command flag CF is cleared when the data is latched in the data latch DL. In this way, the separate use of the command latch CL and the data latch DL can be accomplished. According to this embodiment, the command latch CL is the eight-bit register, the low order two bits are the data flag DF and the command flag CF and the high order four bits are command latch bits. By the way, AIB in FIG. 13 denotes an address input buffer and MPX denotes an address multiplexer.

As described above, the command latched in the command latch CL is decoded by the command decoder DEC and the command flag CF is set. If this processing is handed over to the CPU 10, the CPU 10 must always monitor the content of the command latch CL by activating the bus cycle, and in this case, a waste of operation takes place. Further, if the CPU 10 must analyze all the commands of the command latch CL in accordance with the set condition of the command flag CF which is controlled by the command decoder DEC, the timing of the operation designated by the command may be too late. An example is the read command which reads out the data from the flash memory FMRY2. To cope with this problem, there is provided, inside the internal buses ABUS, DBUS, bus switches BSW1 and BSW2 capable of selectively establishing a state where the command latch CL, the data latch DL and the address latch AL are connected to the flash memory FMRY2 and a state where the command latch CL, the data latch DL and the address latch AL are not connected to the flash memory FMRY2 as shown in FIGS. 13 and 14, and these bus switches BSW1 and BSW2 are controlled by the signal obtained by the decoding result of the read type commands by the decoder DEC. When the bus switches BSW1 and BSW2 are opened, a direct read access can be made to the flash memory from outside the microcomputer MCU3 or in other words, from the PROM writer 30.

[7] Command Specification Data Write and Others in a Flash Memory by Prom Writer Table 3 shows examples of the command specification which may be supplied from the PROM writer 30.

which Vth of the memory becomes negative due to excessive erase and normal read-out cannot be made) during erasing, pre-write is executed for making a write level uniform before beginning the erasing operation, or an erase procedure which effects erasure little by little while effecting verify is employed. The erase verify command (E Verify) is the command for confirming the erase condition. EA represents the memory address for erase verify. EVD represents the erase verify output data. The automatic erase mode (A Erase) is the command for automatically executing erase and erase verify, and after the automatic erase is started, the end of this automatic erasing operation is confirmed by a status polling. A status polling flag SPF is allocated to the high order side bit of the data latch DL shown in FIG. 13. The write command (Program) is the command for designating write, PA represents the write address and PD represents the write data. A program verify command (P Verify) is the command for confirming whether or not the data written immediately before is written correctly, and PVD represents a program verify output data. A reset command (Reset) is the command for resetting the command when this command is mistaken.

The command specification described above has compatibility with the command specification of discrete flash memory LSIs (1M-bit flash memory) of an HN28F101 series described on page 872 of "Hitachi IC Memory Data Book 1" published in September, 1991, though the specification is not particularly limited.

[8] Data Write in a Flash Memory in on-Board State

The designation of the data write in the onboard state and its sequence are all controlled by the CPU 10 and its operation program, and processing such as data write is controlled by setting/clearing each bit of the control register CREG by the software. When the rewrite program is placed on the flash memory FMRY2, for example, the rewrite program is in advance transferred to the RAM at the time of

TABLE 3

| COMMAND | CYCLE NUMBER | 1ST CYCLE | | | 2ND CYCLE | | |
|---|---|---|---|---|---|---|---|
| | | MODE | ADDRESS | DATA | MODE | ADDRESS | DATA |
| READ | 2 | WRITE | X | 00H | READ | RA | DOUT |
| READ ID | 2 | WRITE | X | 90H | READ | IA | ID |
| ERASE | 2 | WRITE | X | 20H | WRITE | X | 20H |
| E VERIFY | 2 | WRITE | X | A0H | READ | X | EVD |
| A ERASE | 2 | WRITE | EA | 30H | WRITE | X | 30H |
| PROGRAM | 2 | WRITE | X | 40H | WRITE | PA | PD |
| P VERIFY | 2 | WRITE | X | C0H | READ | X | PVD |
| RESET | 2 | WRITE | X | FFH | WRITE | X | FFH |

The commands shown in the table are eight kinds, though this number is not particularly limited. The content of the cycle to be activated by the PROM writer 30 in response to each command is also shown. The code of the command corresponds to the data of the first cycle shown in the table. This code is represented by the hexadecimal number and symbol H put at the end of the code means the hexadecimal number. The read command (Read) is the command for reading out the data from the flash memory FMRY2. Symbol RA in the second cycle of this command means the read address. The read ID command (Read ID) is the command for reading out a product identification code (ID) from a product identification code address (IA). The erase command (Erase) is the command for erasing the data of the flash memory. To avoid over-erase (the phenomenon in the data write operation or at the time of resetting of the system, and the CPU 10 executes this program on the RAM so as to execute data rewrite. An example of the sequence of this rewrite processing will be hereinafter described in this item.

The data write in the flash memory is basically effected to the memory cells in an erase state. When rewrite of the flash memory included in the microcomputer is carried out in a state where the microcomputer is mounted onto the system, the rewrite control program to be executed by the CPU 10 includes the erase program and the write program. This rewrite control program can be constituted in such a manner that the erase processing routine is first executed and then the automatic write processing routine is successively executed in accordance with the data write instruction.

Alternatively, the erase operation and the write operation may be separately designated.

Figure 15A:
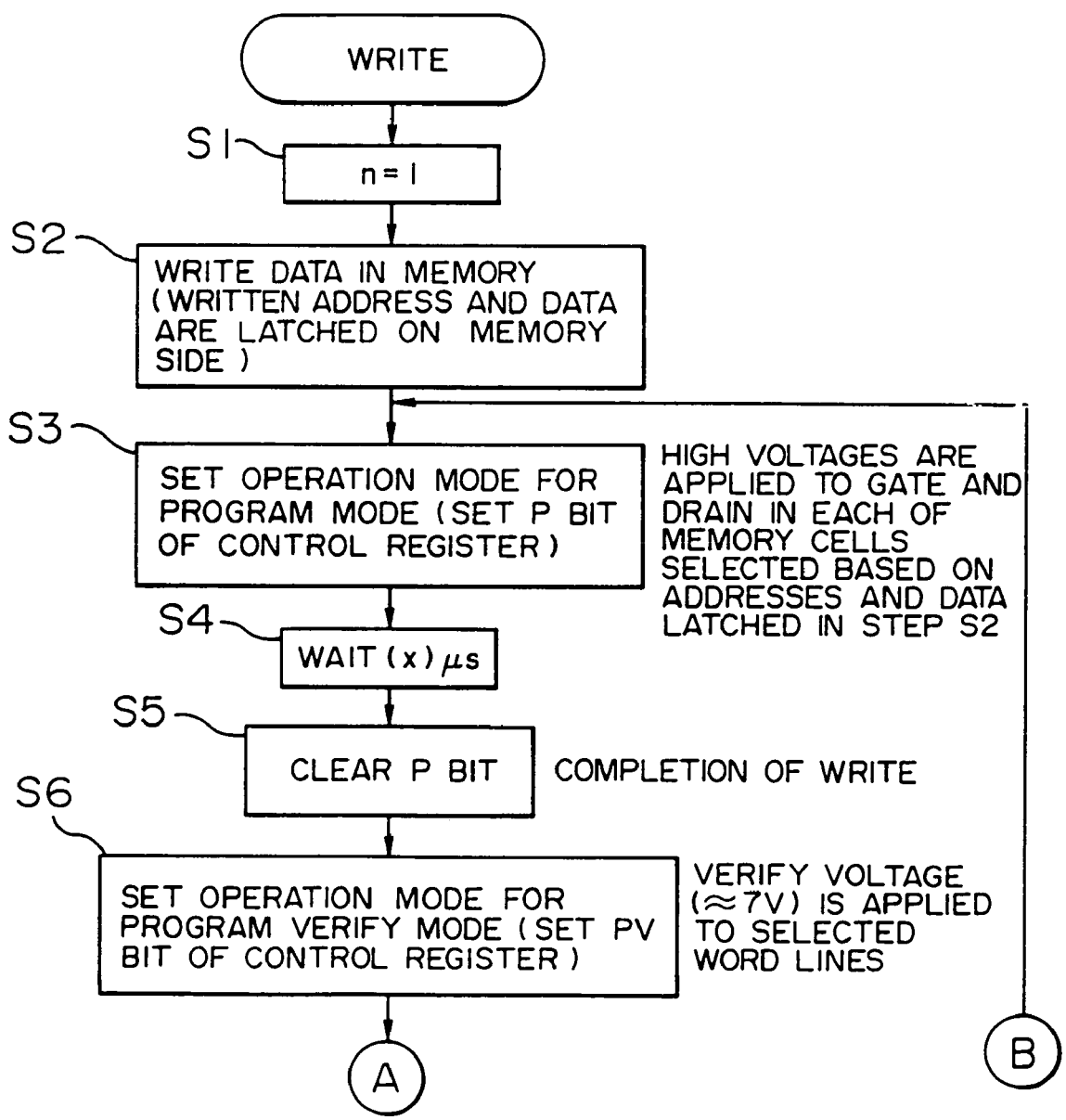
FIGS. 15A and 15B show an exemplary detailed flow-chart of a flash memory write control procedure with the microcomputer in an on-board state.
Figure 15B:
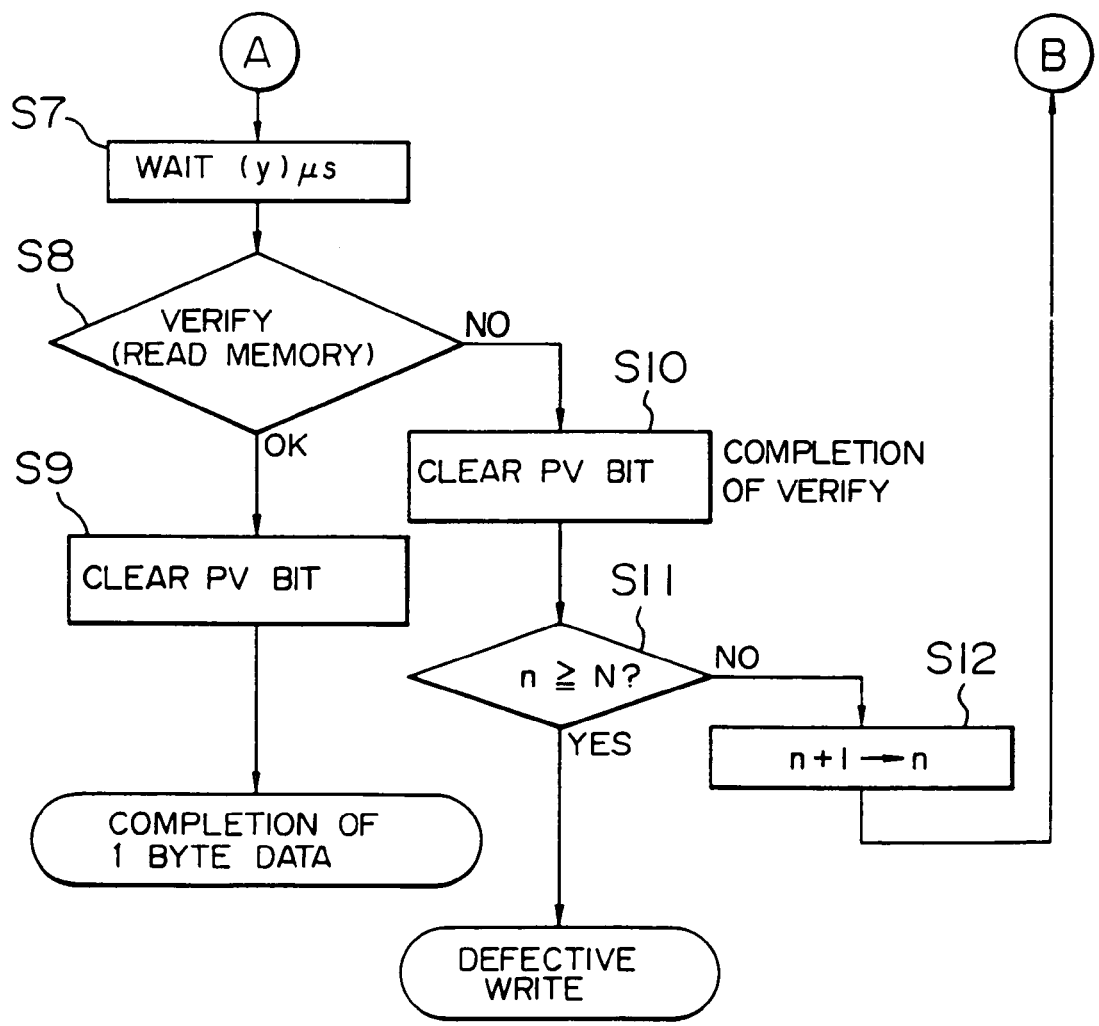

FIGS. 15A and 15B show a detailed example of the write control procedure. The control main body of the procedure shown in the drawings is the CPU 10.

In the first step of writing data in the byte unit, the CPU 10 sets 1 to its built-in counter n (Step S1). Next, the CPU 10 sets the data to be written in the flash memory FMRY2, in the data input latch DIL shown in FIG. 13 and sets the write address in the address latch AIL (Step S2). Then, the CPU 10 issues the write cycle for the control register CREG and sets the program bit P (Step S3). The controlling circuit FCONT applies a high voltage to the control gate and the drain of the memory cell designated by the address on the basis of the data and the address that are set in the Step S2, and executes write. The CPU 10 is in the waiting state for the time (x) μsec as the write processing time on the flash memory side (Step S4), and then clears the program bit P (Step S5). Here, the time (x) μsec is determined in accordance with the characteristics of the memory cell and is 10 μsec, for example.

Thereafter, the CPU 10 issues the write cycle for the control register CREG to confirm the write state and sets the program verify bit PV (Step S6). The controlling circuit FCONT utilizes the address set by the Step S2, applies the verify voltage to the word line to be selected by the address and reads out the data of the memory cell which is written as described above. CPU 10 waits for (y) μsec for this data read out (Step S7). Here, to insure a sufficient write level, the verify voltage is at a voltage level of 7 V higher than the power source voltage of 5 V, for example. The time (y) μsec is determined by the rise characteristics of such a verify power source, and is below 2 μsec, for example. The CPU 10 confirms coincidence between the data thus read out and the data used for write (Step S8). When the CPU 10 confirms this coincidence by verify, it clears the program verify bit PV (Step S9) and in this way, the write operation of this one-byte data is completed.

On the other hand, when the CPU 10 confirms inequality by verify in the Step S8, it clears the program verify bit PV in the Step S10, and then judges whether or not the value of the counter n reaches the upper limit number N of the write re-try (Step S11). When this upper limit number N of the write re-try is reached, the processing is completed as write fault. When the upper limit number N is not reached, the CPU 10 increments by one the value of the counter n (Step S12), and repeats the processing from the Step S3 described above.

Figure 16A:
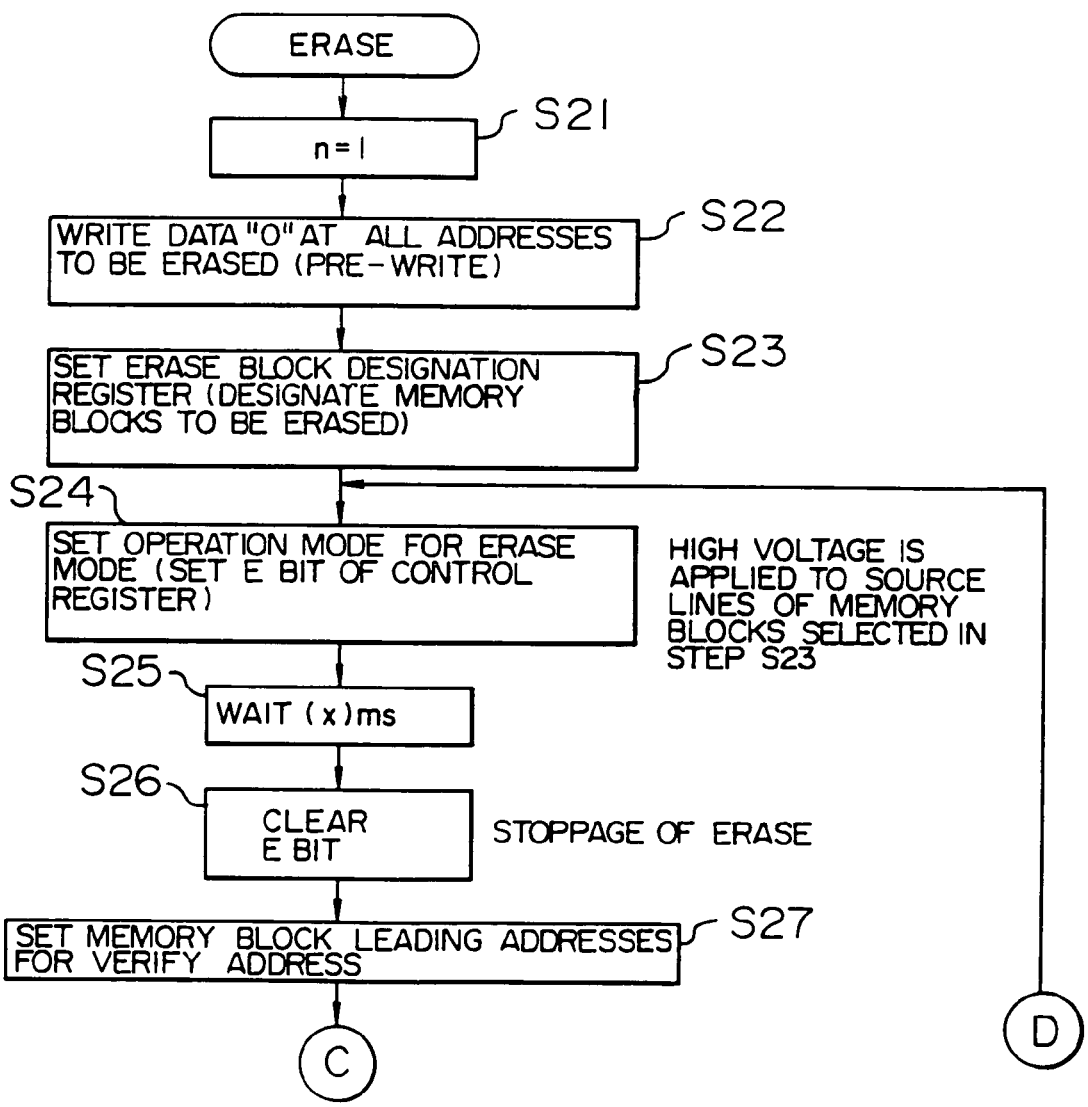
FIGS. 16A and 16B show an exemplary detailed flow-chart of a flash memory erase control procedure with the computer in an on-board state.
Figure 16B:
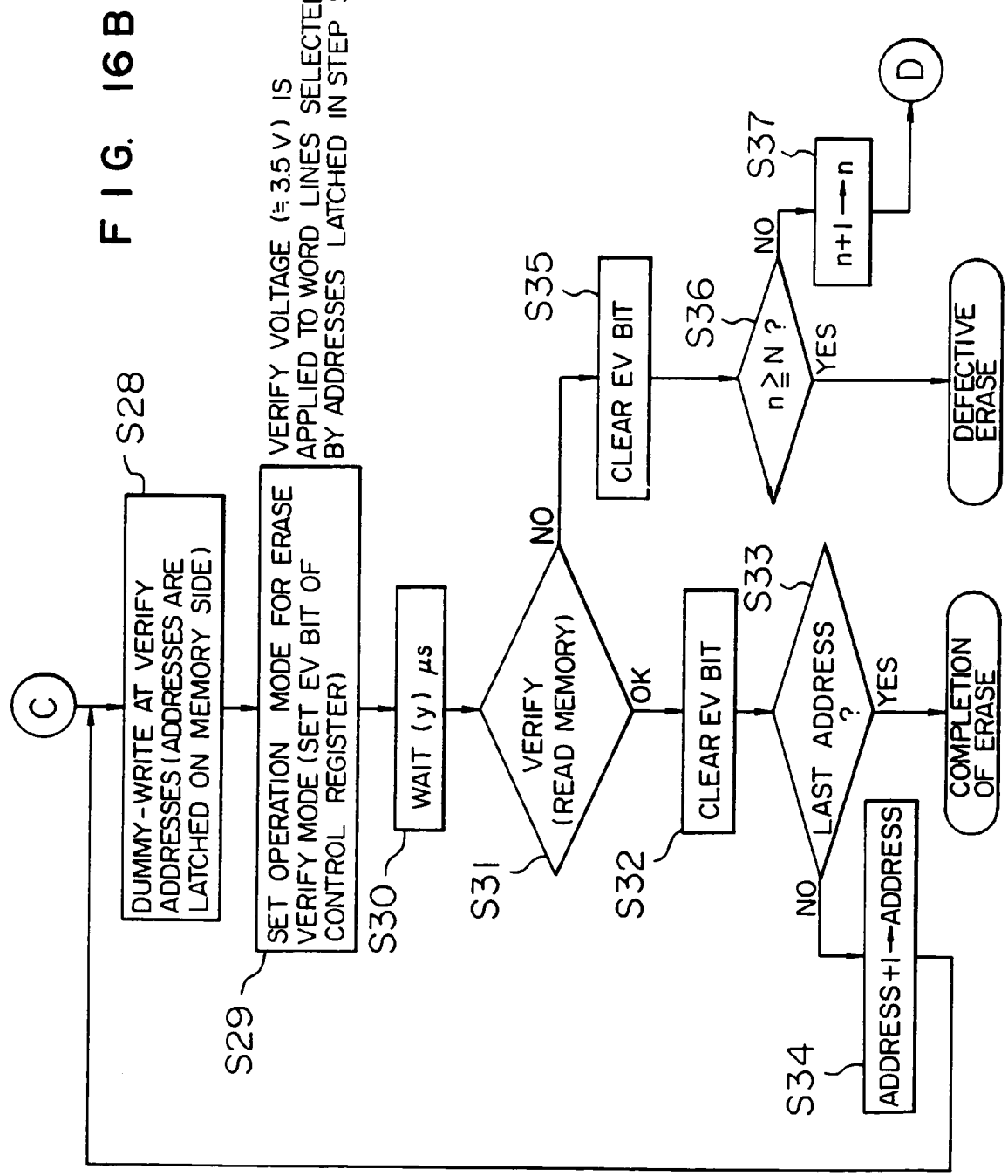

FIGS. 16A and 16B show a detailed example of the erase control procedure. The control main body of the procedure shown in the drawings is the CPU 10.

To effect erase, the CPU 10 sets 1 in its built-in counter n (Step S21). Next, the CPU 10 executes pre-write in the memory cells in the region to be erased (Step S22). In other words, the CPU 10 writes the data "0" in the memory cell of the address where erase is to be effected. The control procedure of this pre-write can use the write control procedure explained with reference to FIGS. 15A and 15B. This pre-write processing is made so as to make uniform the charge quantity inside the floating gate before erase throughout all the bits to thereby make uniform the erase state of each memory cell to be erased.

Next, the CPU 10 issues the write cycle for the erase block designation registers MBREG and designates the memory blocks as the simultaneous erase object (Step S23). In other words, the CPU 10 designates the number of memory blocks to be erased to the erase block designation registers MBREG1 and MBREG2. After the memory blocks to be erased are designated, the CPU 10 issues the write cycle for the control register CREG and sets the erase bit E (Step S24). The controlling circuit FCONT applies the high voltage to the source line of the memory blocks designated in the Step S23 and simultaneously erases the memory blocks. The CPU 10 waits for the time of (x) msec (Step S25). Here, the time (x) msec is determined to match with the characteristics of the memory cell transistors, and is 10 msec, for example. This time (x) msec is shorter than the time in which the erase operation can once be completed. Next, the erase bit E is cleared (Step S26).

Next, to confirm the erase condition, the CPU 10 sets the leading addresses of the memory blocks to be simultaneously erased for the address to be verified (Step S27), and then executes dummy write to the verify address (Step S28). In other words, the CPU 10 issues the memory write cycle to the address to be verified. In consequence, the memory address to be verified is latched in the address latch AIL. Thereafter, the CPU 10 issues the write cycle for the control register CREG and sets the erase verify bit EV (Step S29). Utilizing the address set in the Step S28, the controlling circuit FCONT applies the erase verify voltage to the word line to be selected and reads out the data of the memory cell which is to have been erased as described above. To read the data, the CPU 10 waits for time (y) μsec (Step S30). To insure a sufficient erase level, the erase verify voltage is set for a voltage level of 3.5 V, for example, which is lower than the power source voltage Vcc such as 5 V, for example. The time (y) μsec is determined by the rise characteristics of the verify power source and is the time of shorter than 2 μsec, for example. The CPU 10 verifies whether or not the data read by it coincides with the data under the erase completion state (all "1" bit state) (Step S31). After confirming the coincidence by this verify, the CPU 10 clears the erase verify bit EV (Step S32). Next, whether or not the verify address of this time coincides with the final address of the erased memory block is judged (Step S33), and if it is, the series of the erase operation is completed. When it is not judged as reaching the final address, the verify address is incremented by one (Step S34), and the processing from the Step S28 is again repeated.

On the other hand, when the CPU 10 confirms inequality by the verify operation in the Step S31, it clears the erase verify bit EV in the Step S35 and then judges whether or not the value of the counter n has reached progressively the upper limit number N of erase (Step S36). If this upper limit number N is reached, the processing is completed as an erase fault. If the upper limit number N is not reached, the CPU 10 increments the value of the counter by one (Step S37) and repeats the processing from the Step S24. In order to prevent over-erase in which the threshold voltage of the memory cell becomes negative, erase is gradually repeated in practice every time within a short time such as 10 msec by effecting verify each time.

[9] Data Write Operation by Command System

When the data write mode by the PROM writer is set in the microcomputer MCU3 through the mode signals MD0 to MD2, the data is written in the flash memory FMRY2 by the PROM writer 30 by the system referred to as the "command system". Here, the term "command system" means a system in which a command such as for data writing in the flash memory is given by such command from an external device such as the PROM writer 30. The CPU 10 controls the processing based on the command. The control program for this purpose is stored in the flash memory FMRY2, and this program is transferred to the RAM in response to setting of the data write mode by the PROM writer 30. The CPU 10 executes the control program thus transferred to the RAM. This control program may be partly in common to the program for controlling the data write in the built-in flash memory in the on-board state described already, or may be entirely different. The command specification has already been explained with reference to Table 3. Hereinafter, the operation will be explained for each command.

(1) Write Command (PROGRAM)

Figure 17:
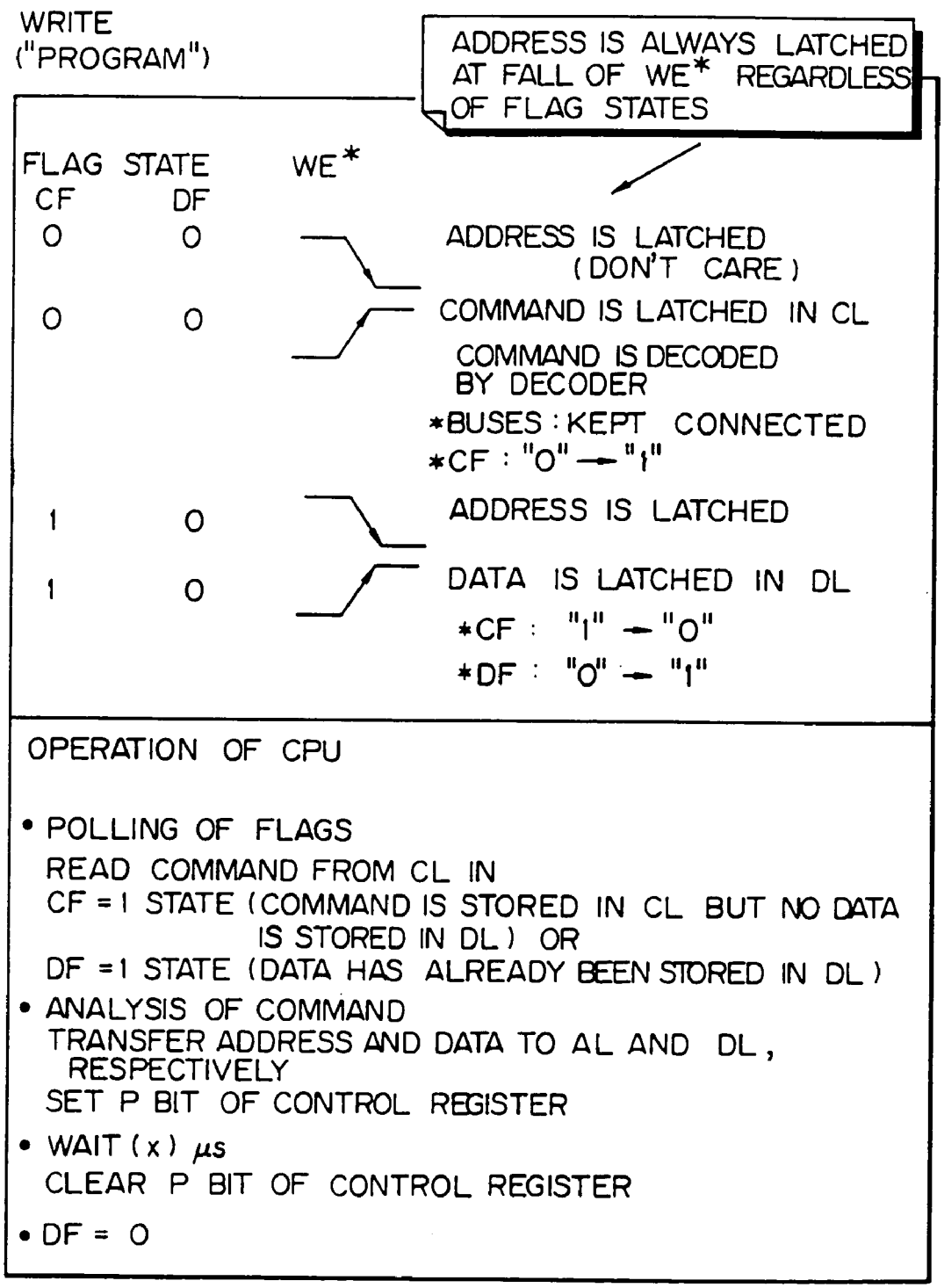
FIG. 17 is an explanatory view showing altogether states of flags CF and DF during the write operation by the PROM writer and the operation of a CPU.

The PROM writer 30 writes, asynchronously with respect to the CPU 10, the command, the data and the address in the command latch CL, the data latch DL and the address latch AL shown in FIG. 13, respectively, in accordance with the command specification shown in Table 3. When the command flag CF is CF=1 (the command has already been inputted) or when the data flag DF is DF=1 (the command has been inputted and further, the data has been inputted), the CPU 10 reads the command, and when the data flag is DF=1 after recognition of the command, it reads the data and the address. The command supplied from the PROM writer 30 is latched in the command latch CL in accordance with the command flag CF=0 and the data flag DF=0. The data to be written in the memory cell is latched in the data latch DL in accordance with the command flag CF=1 and the data flag DF=0. After recognizing that the command, which is read, is the "write command", the CPU 10 reads the address and the data from the address latch AL and the data latch DL, respectively, and transfers them to the address input latch AIL and the data input latch DIL inside the flash memory FMRY2, respectively, according to their control programs. The CPU 10 practically executes write in the memory cell of the flash memory FMRY2 by setting the write bit (P bit) of the control register CREG. The procedure for the practical write processing into the memory cell is substantially the same as the procedure which has been explained with reference to FIGS. 15A and 15B. After the write operation is made, the P bit is cleared, and CF and DF are returned to 0. FIG. 17 altogether shows states of the flags CF and DF in the write operation as well as the operation of the CPU 10.

(2) Write Verify Command (P VERIFY)

Figure 18:
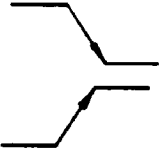
FIG. 18 is an explanatory view showing altogether states of the flags at the time of write verify by the PROM writer and the operation of the CPU.

After the write operation is completed, the write verify mode is essentially executed. This write verify is the operation which confirms whether or not the data written immediately before is certainly written. In the case of this command, too, the operation up to the analysis of the command is executed in the same way as in the write command described above. After confirming that the command is the write verify command, the CPU 10 effects the control in accordance with the following procedure. First, the CPU 10 sets the PV bit (program verify bit) of the control register CREG to "1". At this time, the address used for the write operation immediately before is latched in the address latch AIL inside the flash memory FMRY2. Accordingly, the verify voltage (such as 7 V) is applied to the word line selected by this address. Next, the CPU 10 reads the flash memory FMRY2. In this case, too, the latched address is used as the address. After all, the read operation is executed in the state where the verify voltage is applied as the gate voltage to the memory cell in which write is previously made. The CPU 10 writes this read data in the data latch DL of the port PORT, clears the PV bit and completes the operation. The PROM writer 30 executes verify by reading the value of the data latch DL. FIG. 18 altogether shows states of the flags at the time of verify and the operation of the CPU 10 at this time.

(3) Erase Command (ERASE)

In the microcomputer MCU3 according to this embodiment, the erase operation of the built-in flash memory FMRY2 in the microcomputer MCU3 does not support block erase but only simultaneous erase of a memory cell array (one of ARY0, ARY1, shown in FIG. 3, for example) so that the built-in flash memory is compatible with a 1 M flash memory (HN28F101) in the form of a discrete flash memory LSI described already. As is obvious from the command specification shown in Table 3, the erase operation is started when the erase command is written twice. In the case of erase, too, the operation up to the command analysis is the same as that of the write operation. This erase is started by setting all the bits of the erase block designation registers MBREG1 and MBREG2 for a select state and then setting the E bit (erase bit) of the control register CREG for "1". When the E bit is set, the high voltage is applied to the memory cell array and erase is carried out. After the E bit is set for "1" for a predetermined time, it is cleared and erase is completed. The control procedure of erase of the memory cell is substantially the same as the control content explained with reference to FIGS. 16A and 16B.

(4) Erase Verify Command (E VERIFY)

The verify operation which is executed after erase is similar to the write verify operation. After the command analysis, the CPU 10 reads the address to be verified from the address latch AL of the port and writes it in the flash memory FMRY2. Next, the CPU 10 sets the EV bit of the control register CREG, so that the verify voltage (such as 3.5 V) is applied to the word line selected by the address latched previously. The CPU 10 reads the flash memory FMRY2 in this state, and writes the read data to the data latch DL of the port. Thereafter, the EV bit is cleared and the verify operation is completed.

(5) Automatic Erase Command (A ERASE)

After recognizing the automatic erase command, the CPU 10 executes by itself all the erase flows shown in FIGS. 16A and 16B. In this automatic erase, the flash memory FMRY2 outputs the status polling signal simultaneously with the start of erase, and inverses the signal upon completion of erase. Since the output of the status polling is ED7 (FIG. 8), the seventh bit of the data latch DL (FIG. 13) is used as the bit for storing the status polling signal. The CPU 10 clears the seventh bit (the most significant bit) of the data latch DL simultaneously with the start of erase, and sets upon completion of erase.

(6) Read Command (READ)

When the read command (read type command) is issued, the flash memory FMRY2 must be brought into a state where it can be freely read from the PROM writer 30. When the CPU 10 interprets the command, the time from the input of the command till the point at which the command becomes readable becomes extended and cannot match with the specification of the 1M flash memory. Therefore, the CPU 10 is cut off by the bus switches BSW1 and BSW2 (FIG. 13) in the read mode, and a direct access is permitted from outside to the built-in flash memory FMRY2. The CPU 10 is allowed to input a BREQ (bus request) signal for requesting bus privilege to open from outside, but the bus switches BSW1 and BSW2 physically cut off the bus because a long time is necessary before the CPU 10 opens the bus. Since a long time is necessary if all the commands are passed through the CPU 10, the CPU 10 is instantaneously cut off as soon as the decoder DEC (FIG. 13) recognizes the commands as the read commands. In this case, in order to prevent the CPU 10 from recognizing the input of the command, the command flag CF is kept as CF=0 in the case of the read command, and the command flag CF=0 is changed to the command flag CF=1 only in the case of the other commands.

(7) Reset Command (RESET)

Figure 19A:
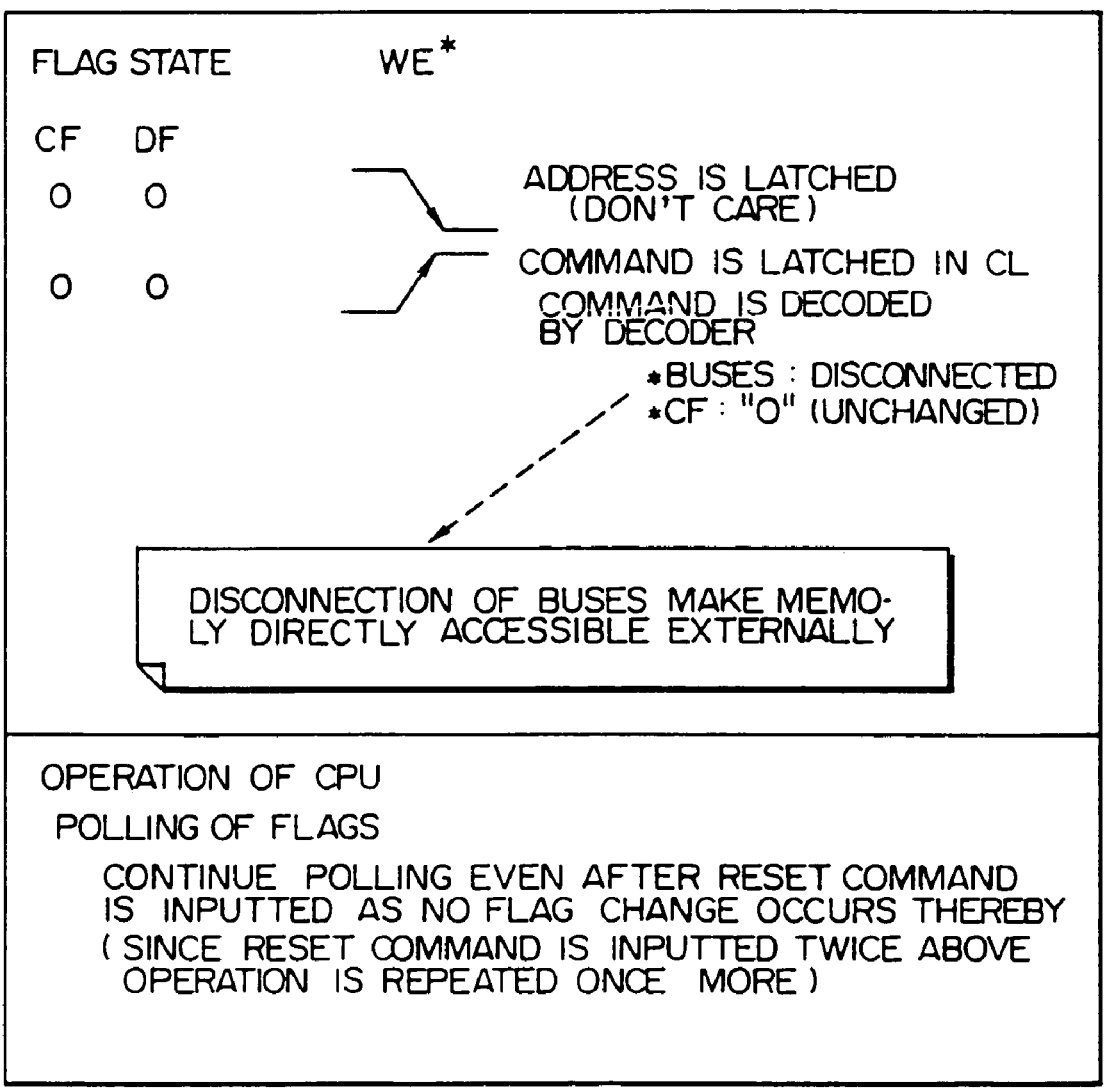

The reset command is prepared to cope with the case where setup of the command is mistaken. As is obvious from the command specification shown in Table 3, reset is completed when this reset command is written twice. If any command is inputted at first and then the command is again inputted in the microcomputer MCU3 according to this embodiment, the command is inputted to the data latch DL. Therefore, there is a possibility that the reset command first written is recognized as the data FFH. However, since the flash memory regards the erase state, where the electrons are extracted from the floating gate, as "1", FFH becomes equal to the state where nothing is written, even though the write command has been inputted beforehand, and there is no problem at all. When the reset command written at the second time is decoded by the command decoder DEC, the mode is brought into the read state as such in the same way as in the read mode, and the operation is completed. FIGS. 19A and 19B altogether show states of the flags in such a reset state and the operation of the CPU 10.

[10] Operation of PROM Writer 30 for Data Write by Command System

Figure 20A:
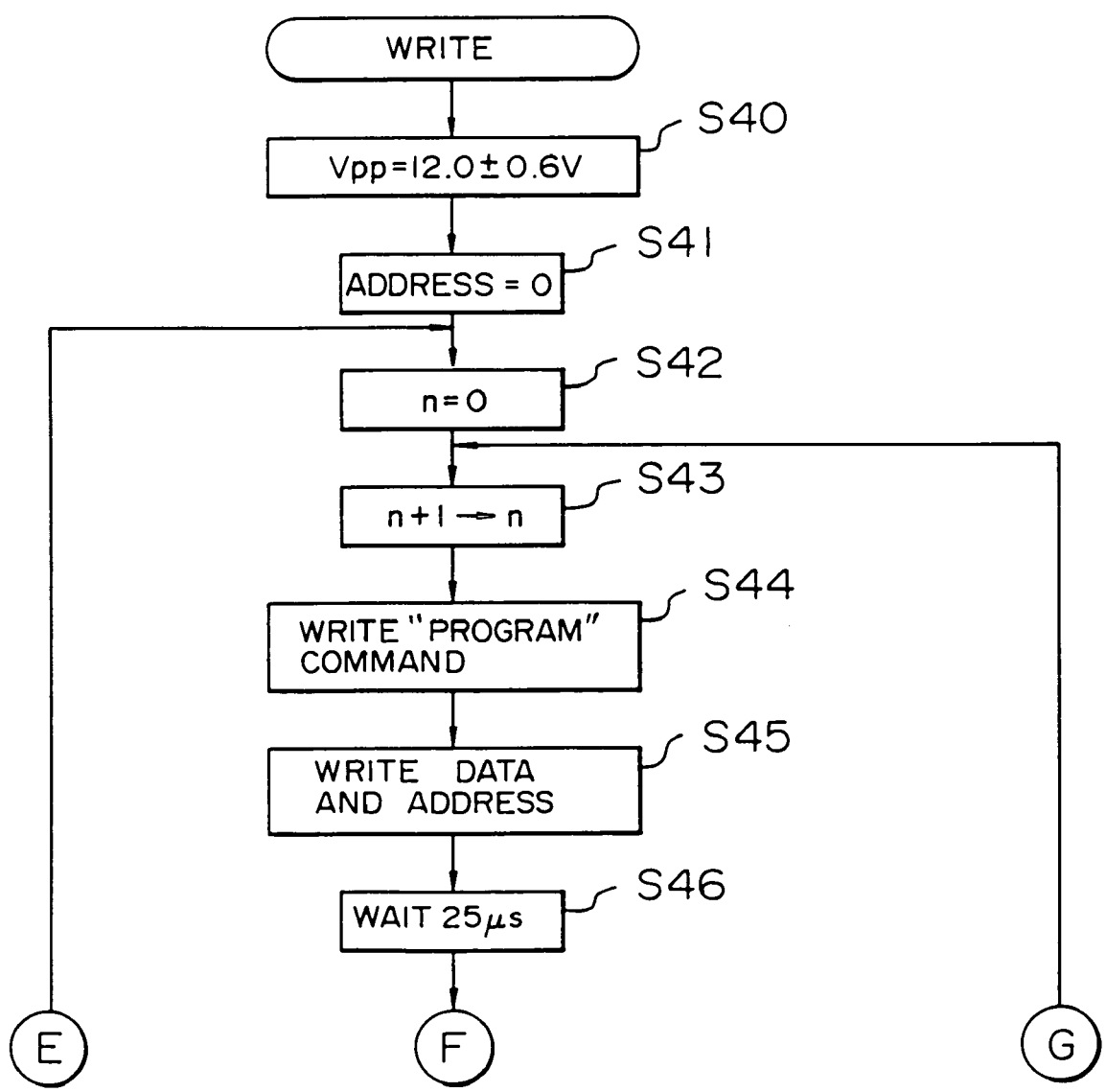
FIGS. 20A and 20B show an exemplary flowchart of the operation of the PROM writer at the time of data write by the command system.
Figure 20B:
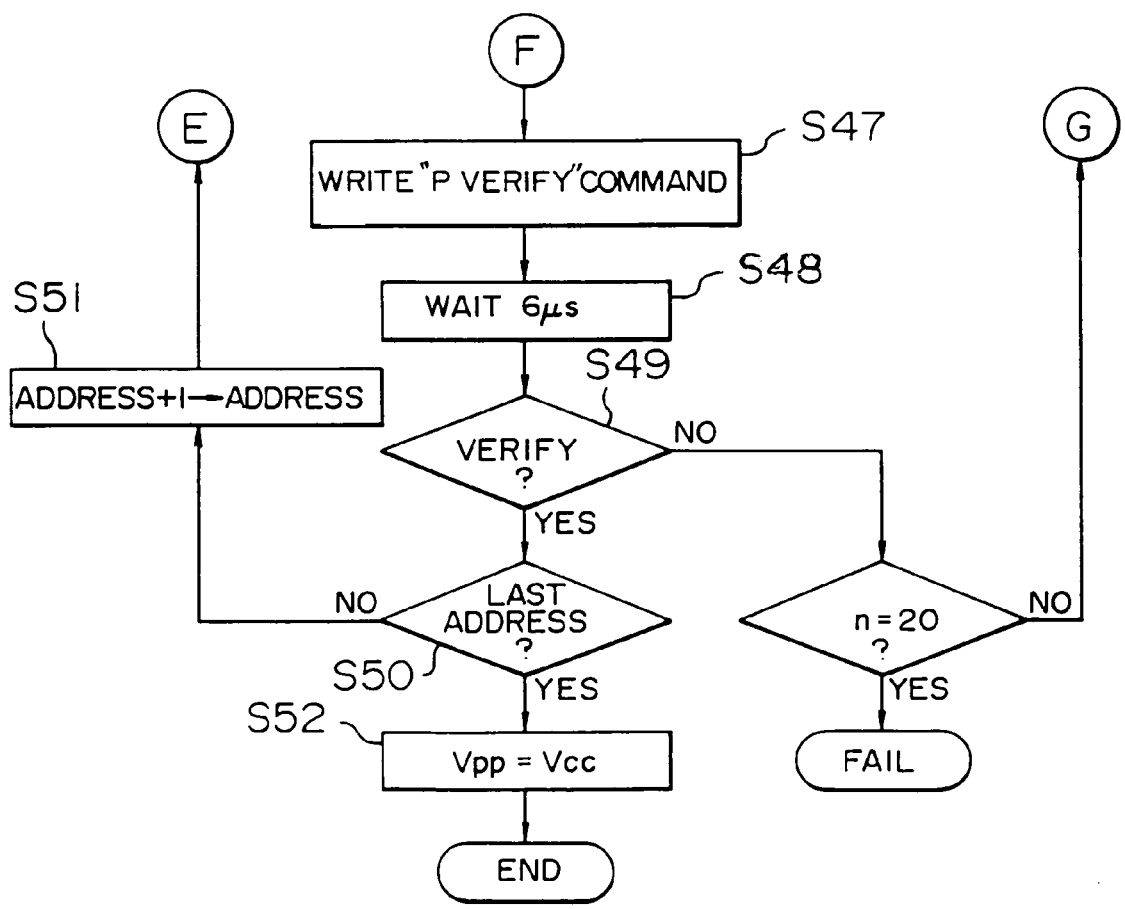

FIGS. 20A and 20B show the operation flow charts of the PROM writer 30 during the data write operation. First, the high voltage necessary for write, such as 12 V, is applied to the terminal Vpp (FIG. 8) (Step S40) so as to initialize the built-in address counter to 0 (Step S41) and to set the counter n for 0 (Step S42). Next, the counter n is incremented by one (Step S43), and then the write cycle of the program is activated so as to write the write command (40H) into the command latch CL (Step S44). The write data (PD) and the write address are written into the data latch DL and the address latch AL, respectively (Step S45). Thereafter, the PROM writer waits for a time of 25 μsec, for example (Step S46). In the interim, the CPU 10 of the microcomputer interprets the command and writes the data in the flash memory FMRY2. The write cycle of the write verify command is activated this time (Step S47), and the PROM writer 30 waits for a time of 6 μsec, for example (Step S48). In the interim, the CPU 10 of the microcomputer MCU 3 interprets this command and reads out the data of the write address in the data latch DL. The PROM writer 30 takes in this read data and judges whether or not write can be effected normally (Step S49). When the result of judgement proves normal, whether or not it is the last write address is judged (Step S50). If it is not the last address, the write address is incremented (Step S51) and the flow then returns to the Step S42. After write is made to the last address, the high voltage Vcc such as 5 V is applied to the terminal Vpp (Step S52) and write is completed. When any write abnormality is judged in the Step S49, the flow returns again to the Step S43 and write is repeated until the value of the counter n reaches maximum 20, for example. If this write abnormality cannot be solved even after this write operation is repeated twenty times, the processing is completed by regarding this address as the defective bit.

Figure 21A:
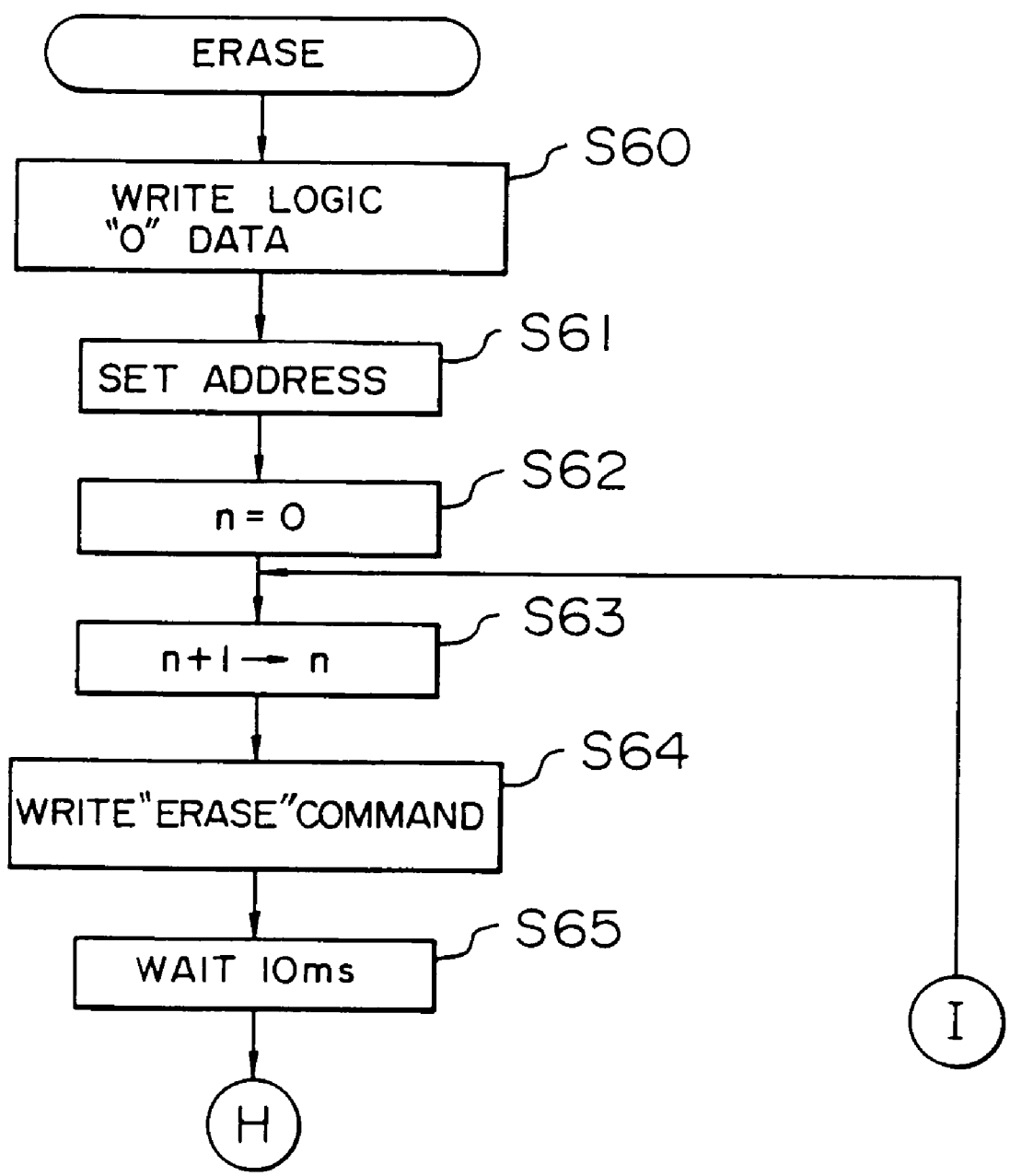
FIGS. 21A and 21B show an exemplary flowchart of the operation of the PROM writer at the time of erase by the command system.
Figure 21B:
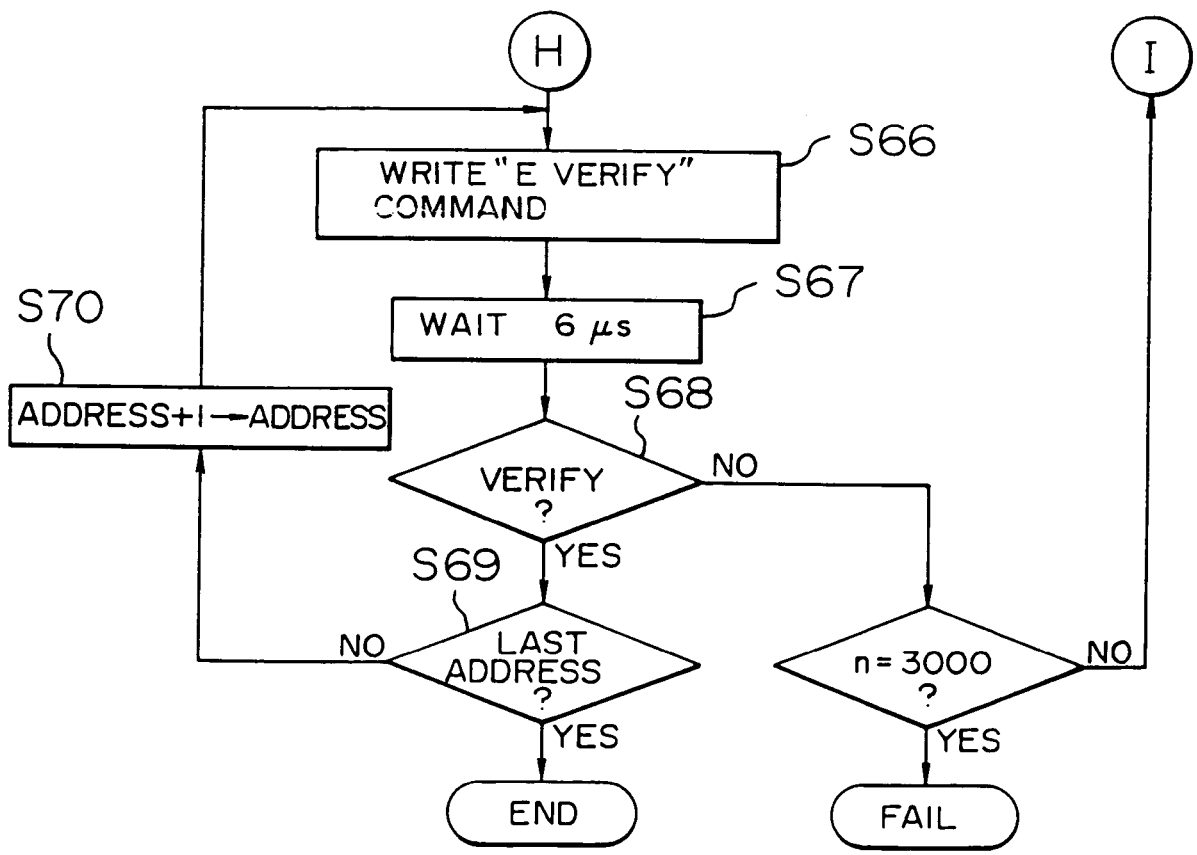

FIGS. 21A and 21B show the operation flow charts of the PROM writer 30 during the erase operation. First, the data of the logic value 0 is written in all the erase object bits of the flash memory. The write processing is made in accordance with the flowcharts shown in FIGS. 20A and 20B.

Next, the leading address of the erase region is set in the address counter (Step S61) and the counter n is set for 0 (Step S62). Next, the counter n is incremented by one (Step S63) and then the erase command (20H) is written in the command latch CL by activating the write cycle of the erase command (Step S64). Thereafter, the PROM writer 30 waits for a time of 10 msec, for example (Step S65). In the interim, the CPU 10 of the microcomputer MCU3 interprets the command and erases the flash memory FMRY2. The write cycle of the erase verify command is activated this time (Step S66) and the PROM writer 30 waits for a time of 6 μsec, for example (Step S67). In the interim, the CPU 10 of the microcomputer MCU3 interprets the command, reads out the data from the erase verify address (EA) and transfers the data to the data latch DL. The PROM writer 30 inputs this read data and judges whether or not erase can be effected normally (Step S68). When the result of judgement proves normal, a judgement is effected as to whether or not the present erase verify address is the last address (Step S69). If it is not the last address, the erase verify address is incremented (Step S70) and then the flow returns to the Step S66. Erase verify is then carried out until the last address and the processing is completed. If erase abnormality is judged in the Step S68, the flow returns again to the Step S63 and erase is repeated until the value of the counter n reaches maximum 3,000, for example. When this erase abnormality cannot yet be solved even after repetition of 3,000 times, the processing is completed by regarding the address as the defective bit.

[11] Operation of CPU for Data Write by Command System

Figure 22:
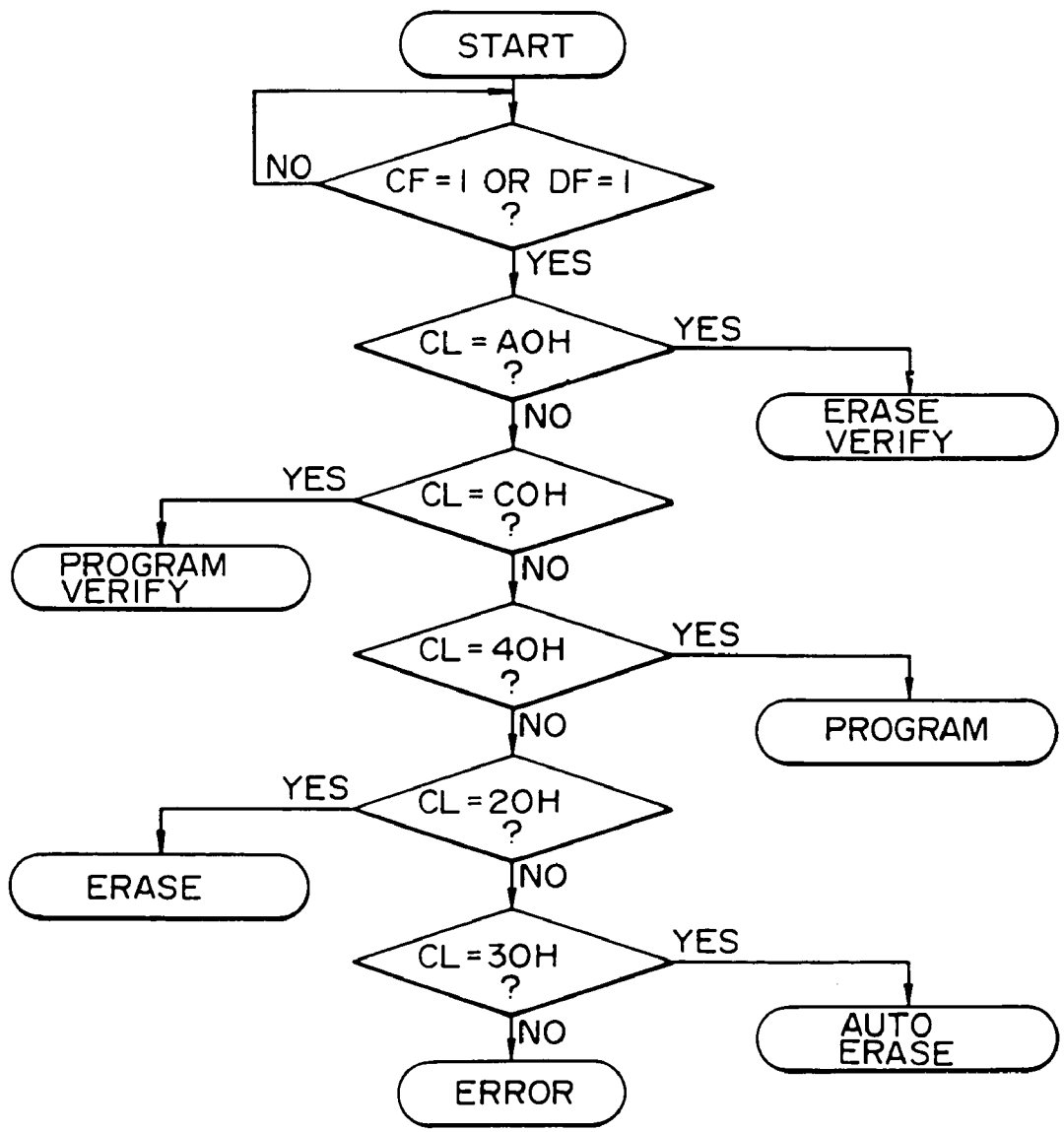
FIG. 22 is a main flowchart showing the processing of the CPU for the command given from the PROM writer.

FIG. 22 shows a main flowchart of the processing by the CPU 10 for various commands described above. The CPU 10 performs polling of the command flag CF and the data flag DF, and upon detecting their set state, the CPU 10 reads the high order four bits of the command latch CL (FIG. 14) and analyzes the command. The processing routine branches to Erase Verify when the command is A0H, to Write Verify (Program Verify) when it is C0H, to write (Program) when it is 40H, to erase when it is 20H, and to automatic erase (Auto Erase) when it is 30H. By the way, the explanation of other commands explained with reference to Table 3 will be omitted.

Figure 23A:
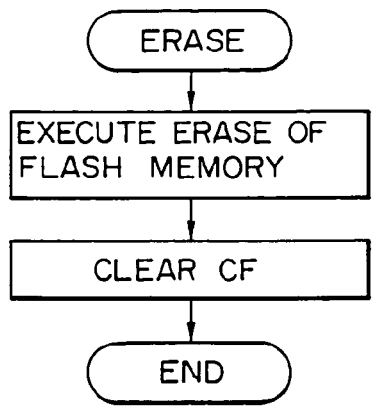
FIGS. 23A and 23B are flowcharts showing processing routine of Erase and a processing routine of Erase Verify shown in FIG. 22.

In the processing routine of Erase, the sequence necessary for erasing the flash memory is controlled as shown in FIG. 23A, the command flag CF is cleared and then the processing is completed.

Figure 23B:
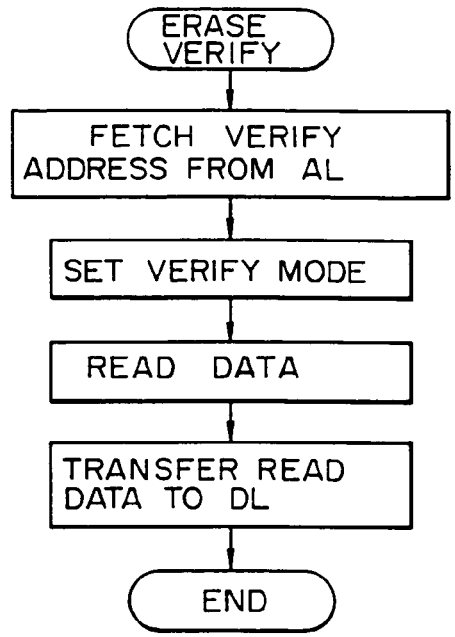

In the processing routine of Erase Verify shown in FIG. 23B, the erase verify address is fetched from the address latch AL, the erase verify mode is set in the control register CREG, and the data from this address is read and transferred to the data latch DL.

Figure 24:
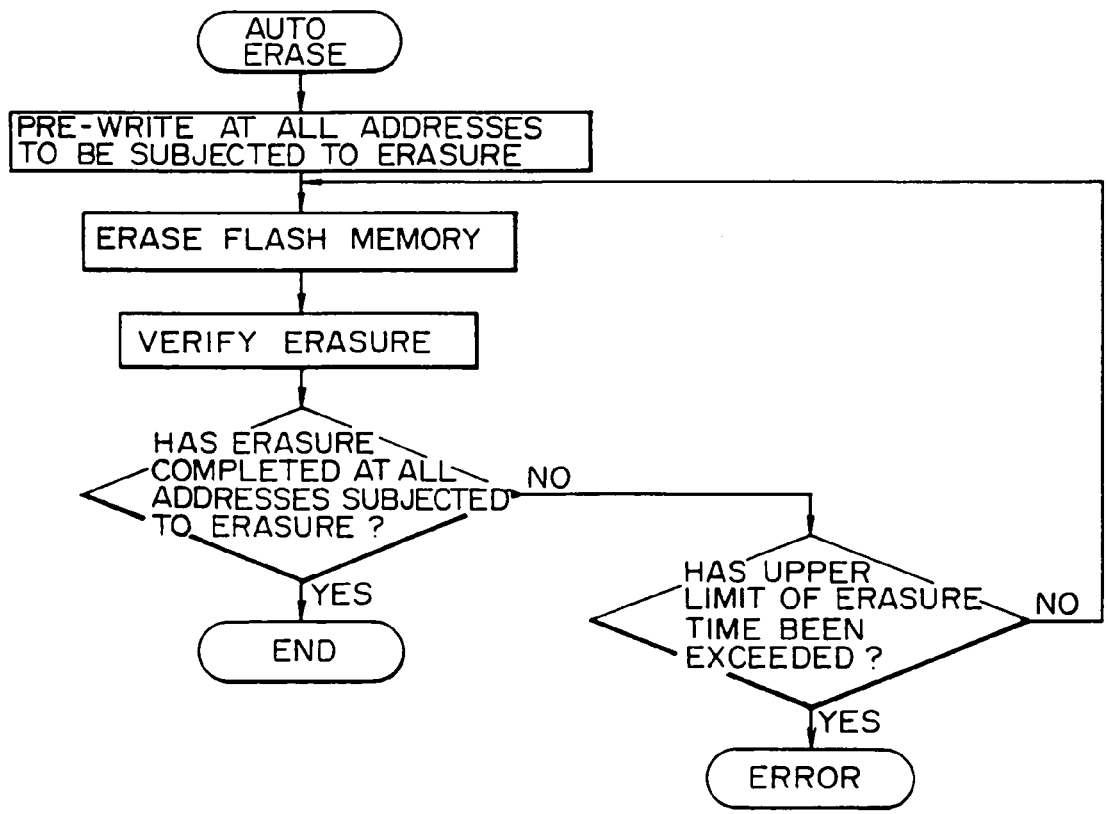
FIG. 24 is a flowchart showing a processing routine of Auto Erase shown in FIG. 22.

In the processing routine of Automatic Erase, control of pre-write execution is made for all the addresses of the built-in flash memory FMRY2 (to be subjected to erase) as shown in FIG. 24, erase control is then made, and erase verify is executed. Control of erase and erase verify is made till completion of erase of all the addresses (to be subjected to erase). When erase abnormality repeatedly occurs and exceeds the upper limit of the erase time in the judgement of the erase condition, the processing is completed with the existence of the defective bit.

Figure 25A:
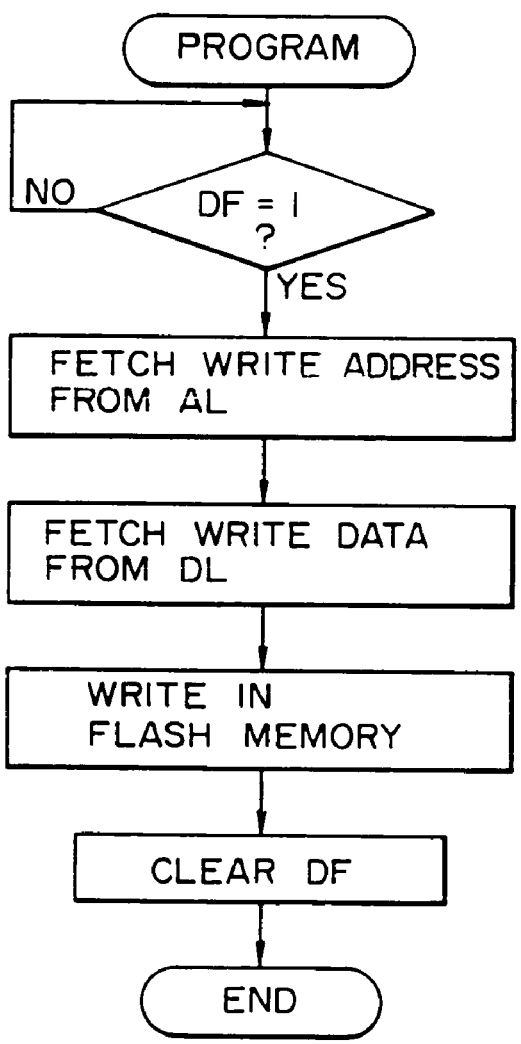
FIGS. 25A and 25B are flowcharts showing a processing routine of Program and a processing routine of Program Verify shown in FIG. 22.

In the processing routine of Program, the set state of the data flag DF is judged as shown in FIG. 25A, the write address is fetched from the address latch AL, the write data is fetched from the data latch DL, write is made in the flash memory FMRY2, and thereafter the processing is completed by clearing the data flag DF.

Figure 25B:
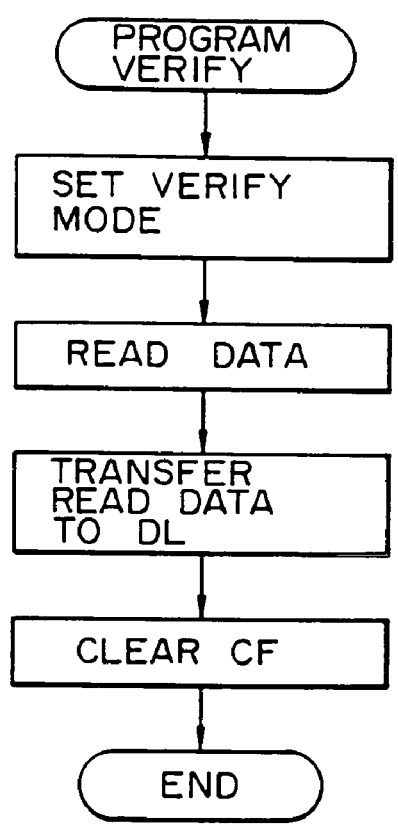

In the processing routine of Program Verify, the program verify mode is set in the control register CREG as shown in FIG. 25B and the data is read out from the write address immediately before, and is transferred to the data latch DL. Further, the command flag CF is cleared and the processing is completed.

[12] Compatibility Between a Flash Memory Built-in in a Data Processing Apparatus and a Discrete Flash Memory LSI in Terms of Write Specification, as Seen from PROM Writer The inventors of the present invention have confirmed compatibility between the specification for writing data in a built-in flash memory FMRY2 by the command system utilizing the PROM writer 30 and the specification for writing the data in a discrete flash memory LSI (HN28F101) using the PROM writer 30. According to the inventors' investigation, various timings must match with the 1M flash memory in order to establish compatibility of data write by the PROM writer 30 with the 1M flash memory discrete LSI (HN28F101) described above. Therefore, investigation has been carried out by practically preparing the control program to examine whether matching of the timings can be obtained. The result of the investigation is shown in Table 4. It has been confirmed from the result of the investigation that compatibility can be obtained at an operation frequency of 16 MHz, for example.

TABLE 4

Response time from write of command in command latch to start of actual operation responsive to the written command

| ITEM | ERASE VERIFY | WRITE VERIFY | ERASE | WRITE |
|---|---|---|---|---|
| RESPONSE TIME BY SOFTWARE CONTROL (OPERATION FREQUENCY: 16 MHz) ACCORDING TO EMBODIMENT | 4.7 μs | 4.8 μs | 5.9 μs | 5.7 μs |
| RESPONSE TIME REQUIRED FOR 1M FLASH MEMORY COMPATIBLE SPECIFICATION | 5 μs OR LESS | 5 μs OR LESS | 1 ms OR LESS | 10 μs OR LESS |
| JUDGEMENT | ○ | ○ | ○ | ○ |

The embodiments described above provide the following functional effects.

(1) The rewrite sequence in accordance with the commands asynchronously given from the PROM writer 30 is accomplished by the built-in circuit of the microcomputer. Therefore, it is only necessary for the PROM writer 30 to write the commands in the command latch in the same way as it gives the data, before the data and the address data are given. Accordingly, data writing can be effected in the flash memory built-in in the microcomputer by connecting the PROM writer 30, which is used widely, through the socket adapter.

(2) The built-in CPU 10 is caused to control the rewrite sequence given by the commands. Therefore, the exclusive circuit for only this control can be eliminated or the number of such circuits can be reduced, and the chip area of the microcomputer can be reduced. Furthermore, the control sequence for rewrite can be changed by the software which the CPU 10 should execute. Accordingly, setting of the conditions such as the write time can be easily effected so as to match with the characteristics of the memory devices constituting the flash memory.

(3) The PROM writer 30 versatilely utilized is so constituted as to apply at least the high voltage for rewrite for the nonvolatile memory device and to supply the address and the data for rewrite in accordance with the write signal, etc, to the object semiconductor device (LSI) inclusive of the flash memory. Such a PROM writer 30 supplies, asynchronously with the CPU 10 built-in in the microcomputer, the commands, the data and the addresses. At this time, there are provided the command flag CF representing that the command is written in the command latch CL, and the data latch DL which is made writable from outside in addition to the command latch CL when this command flag CF represents the command latch state. In this way, collision can be prevented between the commands and the data that are written from the PROM writer 30 in mutually different cycles, on the latch means.

(4) The CPU 10 reads the command of the command latch on the basis of the command latch state of the command flag CF. At this time, the set processing of the command flag can be speeded up because there is provided the command decoder for decoding the latch content of the command latch CL and setting the command flag CF for the command latch state. If the control for the command flag is also assigned to the CPU 10, the CPU 10 must activate the bus cycle and must always monitor the content of the command latch CL, so that a wasteful operation undesirably occurs and the flag processing becomes delayed, as well.

(5) The present invention provides the bus switches BSW1 and BSW2 which cut off the CPU 10 from the flash memory in accordance with the decoding result of the read commands by the command decoder DEC. If the CPU 10 were to analyze all the commands latched in the command latch, the timing of the operation designated by the command would be retarded. However, the present invention can easily cope with the read commands due to the bus switches. This makes it possible to accomplish compatibility, with respect to the write processing, between the discrete flash memory LSI and the flash memory built-in in the microcomputer, as seen from the PROM writer 30.

(6) The program for controlling the rewrite procedure of the flash memory, which is to be executed by the CPU 10, is stored in the flash memory and is transferred to the RAM in response to setting of the rewrite mode by the PROM writer 30. The CPU 10 executes this program transferred to the RAM and, in this way, correction of the rewrite program can be made.

(7) In view of the fact that the quantity of data to be stored in the flash memory becomes different depending on the usage of the data and on the kind of data employed such as the program, the data table, the control data and so forth, a plurality of memory blocks having mutually different memory capacities are provided as a simultaneously erasable unit in the flash memory and in this way, a waste in the write operation caused by simultaneous erase of the memory blocks for local or partial rewrite of the data held in the built-in flash memory after mounting onto the system can be eliminated to improve the rewrite efficiency.

Although the invention has thus been described specifically on the basis of the embodiments thereof, the invention is not particularly limited thereto but can of course be effected via other embodiments and/or various modifications thereof including with respect to thus far disclosed embodiments and schemes without departing from the scope thereof.

For example, the peripheral circuits built-in the microcomputer are not limited to those of the embodiments described above, but can be suitably changed. The memory cell transistors of the flash memory are not limited to the stacked gate structure MOS transistors of the embodiments described above, and FLOTOX type memory cell transistors utilizing the tunnel phenomenon for the write operation may be employed.

Besides the memory blocks sharing the source line in common, those memory blocks which can share the word line in erase can be used as the unit of simultaneous erase. Which of them is to be used is determined by considering the polarity of the erase voltage or by considering which of the number of memory cells to be connected to a single word line and the number of memory cells to be connected to a single data line is smaller when the memory capacity of the simultaneous erase unit is minimized.

The size of the memory blocks is not limited to the fixed size as in the embodiments described above. For example, the size can be made variable in accordance with setting of the control register or with designation of the mode signal. When the simultaneous erase voltage is applied to the word line as being the minimum unit, for example, the operation of the driver for driving the word line by the erase voltage may be selected in accordance with setting of the control register or with the designation of the mode signal.

Further, the mode of division of the memory block may be such that an entire block is first divided into a plurality of large blocks, and then each of the large blocks is divided into a plurality of small blocks so that simultaneous erase can be made in the unit of the large block or small block.

In the system which rewrites the flash memory under the control of the CPU, a software for self tuning the rewrite conditions, etc, can also be employed.

In each memory cell transistor of the flash memory, the source and the drain are relatively recognized in accordance with voltages applied thereto.

The present invention can widely be applied to, other than a microcomputer, a data processing apparatus having at least a central processing unit and an electrically erasable and rewritable nonvolatile flash memory on a single semiconductor chip.

The invention claimed is:

1. A data processing apparatus on a single semiconductor substrate comprising:
a flash memory including a plurality of electrically rewritable nonvolatile memory cells each of which is constructed of a single transistor; and
a central processing unit,
wherein the central processing unit decodes a command supplied from outside of the data processing apparatus during a first operation mode for controlling the flash memory from the outside of the data processing apparatus so as to determine a process to be performed to the flash memory, and
wherein the central processing unit performs the process to the memory cell corresponding to an address supplied from the outside of the data processing apparatus.

2. A data processing apparatus according to claim 1, wherein the command includes:
a program command for instructing a writing of data supplied from the outside of the data processing apparatus to the memory cell,
a program verify command for instructing to verify whether or not the data has been written into the memory cell,
an erase command for instructing an erasure of data stored in the memory cell, and
an erase verify command for instructing to verify whether or not the data has been erased from the memory cell.

3. A data processing apparatus according to claim 2, further comprising:
a first external terminal to which the command is supplied in the first operation mode; and
a command latch circuit coupled to the first external terminal and latching therein the command in the first operation mode.

4. A data processing apparatus according to claim 3, further comprising:
a second external terminal to which the address is supplied in the first operation mode; and
an address latch circuit coupled to the second external terminal and latching therein the address in the first operation mode.

5. A data processing apparatus according to claim 4, further comprising:
a data latch circuit for latching therein the data in the first operation mode.

6. A data processing apparatus according to claim 5, further comprising:
a command flag coupled to the command latch circuit and indicating whether or not the command has been written in the command latch circuit; and
a data flag coupled to the data latch circuit and indicating whether or not data has been written in the data latch circuit,
wherein the data latch circuit is coupled to the first external terminal, and
wherein the data latch circuit latches the data when the command flag indicates that the command has been written in the command latch circuit.

7. A data processing apparatus according to claim 6, wherein the central processing unit decodes the command in response to a command flag indicating that the command has been written in the command latch circuit.

8. A data processing apparatus according to claim 7, wherein the command further includes a read command for instructing a reading of data from the memory cell according to the address in the first operation mode, and
wherein the data processing apparatus further comprises:
an internal bus coupled to the central processing unit, to the flash memory, to the data latch circuit, to the command latch circuit, and to the address latch circuit;
a gate circuit provided in the internal bus, the gate circuit selectively establishing:
a first state in which the command latch circuit, the address latch circuit and the data latch circuit are coupled to the flash memory and the central processing unit, and
a second state in which the command latch circuit, the address latch circuit and the data latch circuit are coupled to the flash memory but not to the central processing unit; and
a command decoder coupled to the command latch circuit and providing a control signal to the gate circuit so as to bring the gate circuit into the second state when the command decoder decodes the read command in the first operation mode.

9. A data processing apparatus according to claim 7, further comprising:
a control register having control bits for indicating processes to be performed to the flash memory, wherein the central processing unit writes data into one of the control bits in accordance with the decoding result of the command during the first operation mode.

10. A data processing apparatus according to claim 2, wherein the flash memory includes a plurality of memory blocks each of which is a unit for a simultaneous erasure.

11. A data processing apparatus according to claim 10, wherein each memory block includes memory cells each having a control electrode coupled to a word line, a first main electrode coupled to a data line and a second main electrode coupled to a source line, and
wherein each of the memory blocks includes one common source line, at least one word line and at least one data line, the ones of the memory cells coupled to the one word line or the one data line in each memory block being coupled to the common source line of that memory block so that each memory block forms a unit for simultaneous erasure.

12. A data processing apparatus according to claim 10, wherein the plurality of memory blocks in the flash memory have mutually different storage capacities.

13. A data processing apparatus according to claim 10, wherein the data processing apparatus further has a second operation mode for controlling a writing and an erasing of data to and from the flash memory, and
wherein the central processing unit generates an address for the flash memory in the second operation mode.

14. A data processing apparatus according to claim 13, further comprising:
a control register having control bits for indicating processes to be performed to the flash memory, wherein the central processing unit writes data into one of the control bits in accordance with the decoding result of the command during the first and second operation modes, and
an erase block designation register having bits for designating one or more memory blocks to be erased, wherein the central processing unit writes data into one or more bits which corresponds to the memory blocks to be erased during the second operation mode.

15. A data processing apparatus according to claim 1, wherein each memory cell has a control electrode coupled to a word line, a floating gate, a first main electrode coupled to a data line and a second main electrode coupled to a source line.

16. A data processing apparatus on a semiconductor integrated circuit device comprising:
a simultaneous erase type EEPROM; and
a central processing unit,
wherein the central processing unit is responsive to a command supplied from outside of the data processing apparatus and performs a process instructed by the command to the simultaneous erase type EEPROM by executing an erase control program and/or a write control program during a first operation mode for controlling an operation of the simultaneous erase type EEPROM from the outside of the data processing apparatus.

17. A data processing apparatus acocrding to claim 16, wherein the data processing apparatus further has a second operation mode for an erasing and/or a writing of data from or to the simultaneous erase type EEPROM, wherein the central processing unit generates an address to be supplied to the simultaneous erase type EEPROM during the second operation mode, and
wherein an address to be applied to the simultaneous erase type EEPROM is supplied from the outside of the data processing apparatus during the first operation mode.

18. A data processing apparatus according to claim 16, wherein the command includes:
a program command for instructing a writing of data supplied from the outside of the data processing apparatus to a memory cell of the simultaneous erase type EEPROM,
a program verify command for instructing to verify whether or not the data has been written into the memory cell,
an erase command for instructing an erasure of data stored in the memory cell, and
an erase verify command for instructing to verify whether or not the data has been erased from the memory cell.

19. A data processing apparatus according to claim 16, further comprising:
a first external terminal to which the command is supplied in the first operation mode; and
a command latch circuit coupled to the first external terminal and latching therein the command in the first operation mode.

20. A data processing apparatus according to claim 19, further comprising:
a second external terminal to which the address is supplied in the first operation mode; and
an address latch circuit coupled to the second external terminal and latching therein the address in the first operation mode.

21. A data processing apparatus according to claim 20, further comprising:
a data latch circuit for latching the data in the first operation mode.

22. A data processing apparatus according to claim 21, further comprising:
a command flag coupled to the command latch circuit and indicating whether or not the command has been written in the command latch circuit; and
a data flag coupled to the data latch circuit and indicating whether or not data has been written in the data latch circuit,
wherein the data latch circuit is coupled to the first external terminal, and
wherein the data latch circuit latches the data when the command flag indicates that the command has been written in the command latch circuit.

23. A data processing apparatus according to claim 22, wherein the central processing unit decodes the command in response to the command flag indicating that the command has been written in the command latch circuit.

24. A data processing apparatus according to claim 23, wherein the command further includes a read command for instructing a reading of data from the memory cell according to the address in the first operation mode, and
wherein the data processing apparatus further comprises:
an internal bus coupled to the central processing unit, to the flash memory, to the data latch circuit, to the command latch circuit, and to the address latch circuit;
a gate circuit selectively establishing:
a first state in which the command latch circuit, the address latch circuit and the data latch circuit are coupled to the simultaneous erase type EEPROM and the central processing unit, and a second state in which the command latch circuit, the address latch circuit and the data latch circuit are coupled to the simultaneous erase type EEPROM but not to the central processing unit; and a command decoder coupled to the command latch circuit and providing a control signal to the gate circuit so as to bring the gate circuit into the second state when the command decoder decodes the read command in the first operation mode.

25. A data processing apparatus according to claim 19, further comprising:

a control register having control bits for indicating processes to be performed to the simultaneous erase type EEPROM, wherein the central processing unit writes data into one of the control bits in accordance with the decoding result of the command during the first operation mode.

26. A data processing apparatus according to claim 17, wherein the simultaneous erase type-EEPROM includes a plurality of memory-blocks each of which is a unit for a simultaneous erasure.

27. A data processing apparatus according to claim 26, wherein each memory block includes memory cells each having a control electrode coupled to a word line, a floating gate, a first main electrode coupled to a data line and a second main electrode coupled to a source line, and wherein each of the memory blocks includes one common source line, at least one word line and at least one data line, the memory cells coupled to the one word line or the one data line in each memory block being coupled to the common source line of that memory block so that each memory block forms the unit for simultaneous erasure.

28. A data processing apparatus according to claim 26, wherein the plurality of memory blocks have mutually different storage capacities.

29. A data processing apparatus according to claim 26, wherein the data processing apparatus further has a second operation mode for controlling a writing and an erasing of data to and from the flash memory, and wherein the central processing unit generates an address for the flash memory in the second operation mode, and wherein the data processing apparatus further comprises:

a control register having control bits for indicating processes to be performed to the simultaneous erase type EEPROM, wherein the central processing unit writes data into one of the control bits in accordance with the decoding result of the command during the first and second operation modes, and an erase block designation register having bits for designating one or more memory blocks to be erased, wherein the central processing unit writes data into one or more bits which corresponds to one or more memory blocks to be erased during the second operation mode.

30. A data processing apparatus according to claim 16, wherein the simultaneous erase type EEPROM includes a plurality of memory cells each of which has a control electrode coupled to a word line, a floating gate, a first main electrode coupled to a data line and a second main electrode coupled to a source line.

31. A data processing apparatus acocrding to claim 16, further comprising:

a command decoder coupled to receive the command and providing a control in the first operation mode.

32. A data processing apparatus on a single semiconductor substrate, comprising:

an electrically erasable and programmable nonvolatile flash memory;

a central processing unit; and a latch circuit for latching a command asynchronously supplied from outside of the data processing apparatus during an operation mode for controlling an operation of the flash memory from the outside of the data processing apparatus, wherein the central processing unit is responsive to the command latched in the latch circuit and performs a process instructed by the command to the flash memory.

33. A data processing apparatus acocrding to claim 32, wherein the flash memory includes a plurality of nonvolatile memory cells each of which has:

a source region and a drain region formed in the semiconductor substrate, an insulating film on a surface of the semiconductor substrate above a spacing between the source and the drain region, a floating gate on the insulating film, an oxide film on the floating gate, and a control gate on the oxide film.

34. A data processing apparatus acocrding to claim 32, wherein the command includes:

a program command for instructing to write data supplied from the outside of the data processing apparatus to a memory cell of the flash memory, a program verify command for instructing to verify whether or not the data has been written into the memory cell, an erase command for instructing to erase data stored in the memory cell, and an erase verify command for instructing to verify whether or not the data has been erased from the memory cell.

35. A data processing apparatus according to claim 33, further comprising:

a command decoder coupled to the command latch circuit for decoding the command in the operation mode.

36. A data processing apparatus acocrding to claim 33, further comprising:

an address latch circuit for latching therein an address supplied from the outside of the data processing apparatus in the operation mode; and a data latch circuit for latching therein data which is to be written to the memory cell and which is supplied from the outside of the data processing apparatus in the operation mode.

37. A data processing apparatus according to claim 34, further comprising:

a control register having control bits for indicating processes to be performed to the flash memory, wherein the central processing unit writes data into one of the control bits in accordance with the command during the operation mode.

38. A data processing apparatus on a semiconductor substrate, comprising:

a flash memory including electrically erasable and programmable nonvolatile memory cells;

a central processing unit; and a memory which stores an erase and a write control program which are to be executed by the central processing unit in an external write operation mode in which the flash memory is made erasable and writable in accordance with a command supplied from outside of the data processing apparatus, and wherein the central processing unit is responsive to the command and executes the erase and/or the write control program in the memory so as to perform a process instructed by the command to the flash memory.

39. A data processing apparatus according to claim 38, wherein the command includes:
   a program command for instructing a writing of data supplied from the outside of the data processing apparatus to a memory cell of the flash memory,
   a program verify command for instructing to verify whether or not the data has been written into the memory cell,
   an erase command for instructing an erasure of data stored in the memory cell, and
   an erase verify command for instructing to verify whether or not the data has been erased from the memory cell.

40. A data processing apparatus according to claim 39, further comprising:
   a command decoder coupled to receive the command and for decoding the command in the external write operation mode.

41. A data processing apparatus on a single semiconductor substrate, comprising:
   a central processing unit;
   an electrically erasable and programmable nonvolatile flash memory; and
   wherein the apparatus has an external write operation mode in which the flash memory is erasable and writable in accordance with commands supplied from outside of the apparatus, and further comprises:
   a command latch circuit for latching the command in the external write operation mode;
   a command analysis circuit for analyzing the command latched in the command latch circuit to provide control signals according to an analyzing result of the command; and
   a sequence control circuit for controlling a sequence of erasing and/or writing the flash memory in accordance with the control signals.

* * * * *